United States Patent [19]

Funai et al.

[11] Patent Number: 5,550,070
[45] Date of Patent: Aug. 27, 1996

[54] METHOD FOR PRODUCING CRYSTALLINE SEMICONDUCTOR FILM HAVING REDUCED CONCENTRATION OF CATALYST ELEMENTS FOR CRYSTALLIZATION AND SEMICONDUCTOR DEVICE HAVING THE SAME

[75] Inventors: Takashi Funai, Tenri; Naoki Makita, Nara; Yoshitaka Yamamoto, Yamatokoriyama; Tatsuo Morita, Soraku-gun, all of Japan

[73] Assignee: Sharp Kabushiki Kaisha, Osaka, Japan

[21] Appl. No.: 357,653

[22] Filed: Dec. 16, 1994

[30] Foreign Application Priority Data

Dec. 27, 1993 [JP] Japan .................................. 5-331626
Jun. 27, 1994 [JP] Japan .................................. 6-144967

[51] Int. Cl.$^6$ .......................... H01L 21/336; H01L 21/20; H01L 21/265
[52] U.S. Cl. .............. 437/41; 437/101; 437/233; 117/8; 148/DIG. 16
[58] Field of Search ............... 437/233, 21, 40 TFT, 437/41 TFT; 148/DIG. 118, DIG. 16; 117/4, 8, 7

[56] References Cited

U.S. PATENT DOCUMENTS

| 5,112,764 | 5/1992 | Mitra et al. | 437/40 TFT |
| 5,147,826 | 9/1992 | Liu et al. | 437/21 |
| 5,275,851 | 1/1994 | Fonash et al. | 437/21 |
| 5,330,935 | 7/1994 | Dobuzinsky et al. | 437/DIG. 118 |
| 5,403,772 | 4/1995 | Zhang et al. | 437/101 |
| 5,426,064 | 6/1995 | Zhang et al. | 437/DIG. 16 |

FOREIGN PATENT DOCUMENTS

| 62-122172 | 6/1987 | Japan . |
| 3-290924 | 12/1991 | Japan . |
| 4-165613 | 6/1992 | Japan . |
| 5-55142 | 3/1993 | Japan . |
| 5-136048 | 6/1993 | Japan . |
| 6-244205 | 9/1994 | Japan . |
| 6-260651 | 9/1994 | Japan . |
| 6-268212 | 9/1994 | Japan . |

OTHER PUBLICATIONS

Wolf et al., Silicon Processing for the VLSI Era, vol. 1: Process Technology, Lattice Press 1986, pp. 215–219.

Aizenberg et al., "Low Temperature Oxidation of Si in the Presence of Oxide Catalysts", in *Insulating Films on Semiconductors*, 1983, pp. 229–233.

Cammarata et al., "NiSi$_2$ precipitation in nickel-implanted silicon films", Appl. Phys. Lett. vol. 51, No. 14, 5 Oct. 1987, pp. 1106–1108.

Kuznetsov et al, "Silicide precipitate formation and solid phase regrowth of Ni$^+$-implanted amorphous silicon", Inst. Phys. Conf. Ser. No. 134: Section 4, Paper presented at Microsc. Semicond. Mater. Conf., Oxford, 5–8 Apr. 1993, pp. 191–194.

Cammarata et al., "Silicide Precipitation and Silicon Crystallization in Nickel implanted amorphous silicon thin films," J. Mater. Research, vol. 5, No. 10, Oct. 1990, pp. 2133–2138.

(List continued on next page.)

*Primary Examiner*—Mary Wilczewski
*Attorney, Agent, or Firm*—Nixon & Vanderhye P.C.

[57] ABSTRACT

A method for producing a semiconductor film, includes the steps of: (a) forming an amorphous semiconductor film on a substrate having a surface with an insulating property; (b) introducing a material for accelerating crystallization of the amorphous semiconductor film into at least a part of the amorphous semiconductor film; (c) crystallizing the amorphous semiconductor film by heating to obtain a crystalline semiconductor film from the amorphous semiconductor film; and (d) oxidizing a surface of the crystalline semiconductor film to form a semiconductor oxide film containing a part of the material for accelerating the crystallization on the surface of the crystalline semiconductor film.

27 Claims, 13 Drawing Sheets

OTHER PUBLICATIONS

Hayzelden et al, "Silicide formation and silicide–mediated crystallization of nickel–implanted amorphous silicon thin films," J. Appl. Phys. vol. 73, No. 12, 15 Jun. 1993, pp. 8279–8289.

Dvurechenskii et al., "Transport Phenomena in Amorphous Silicon Doped by Ion Implantation of 3d Metals", Phys. stat. sol. (a) vol. 95, 1986, pp. 635–640.

Kuznetsov et al. "Enhanced Solid Phase Epitaxial Recrustallization of Amorphous silicon due to nickel silicide precipitation resulting from ion implantation and annealing", Nuclear Instruments and Methods in Physics Research. B80/81, 1993, pp. 990–993.

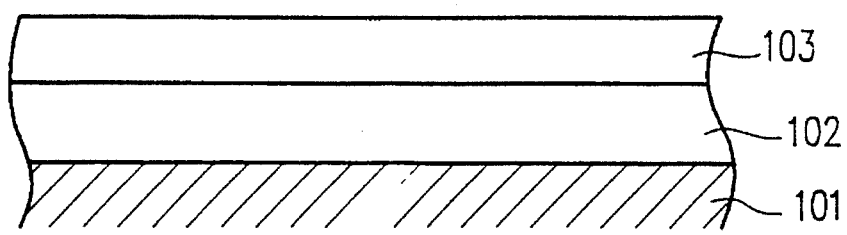
FIG.1
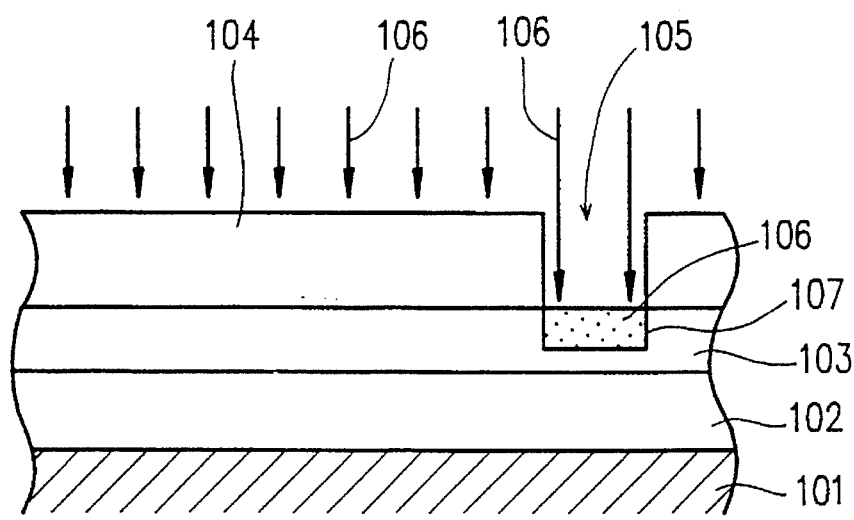
FIG.2
FIG.3
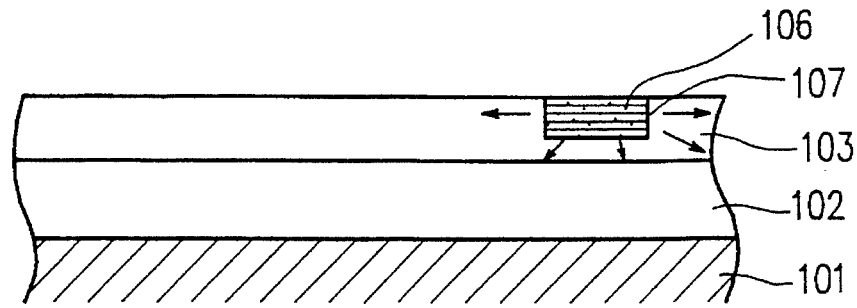
FIG.4
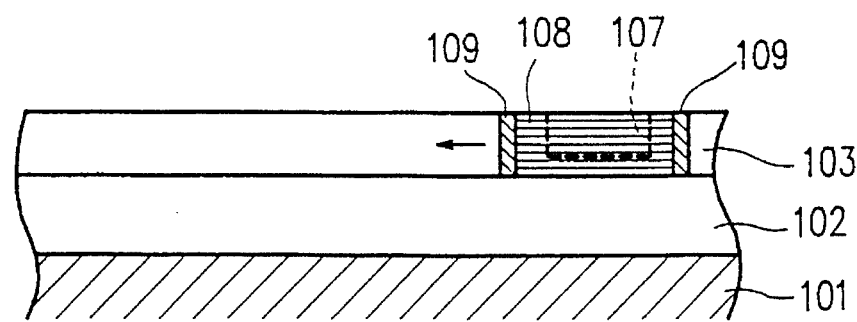

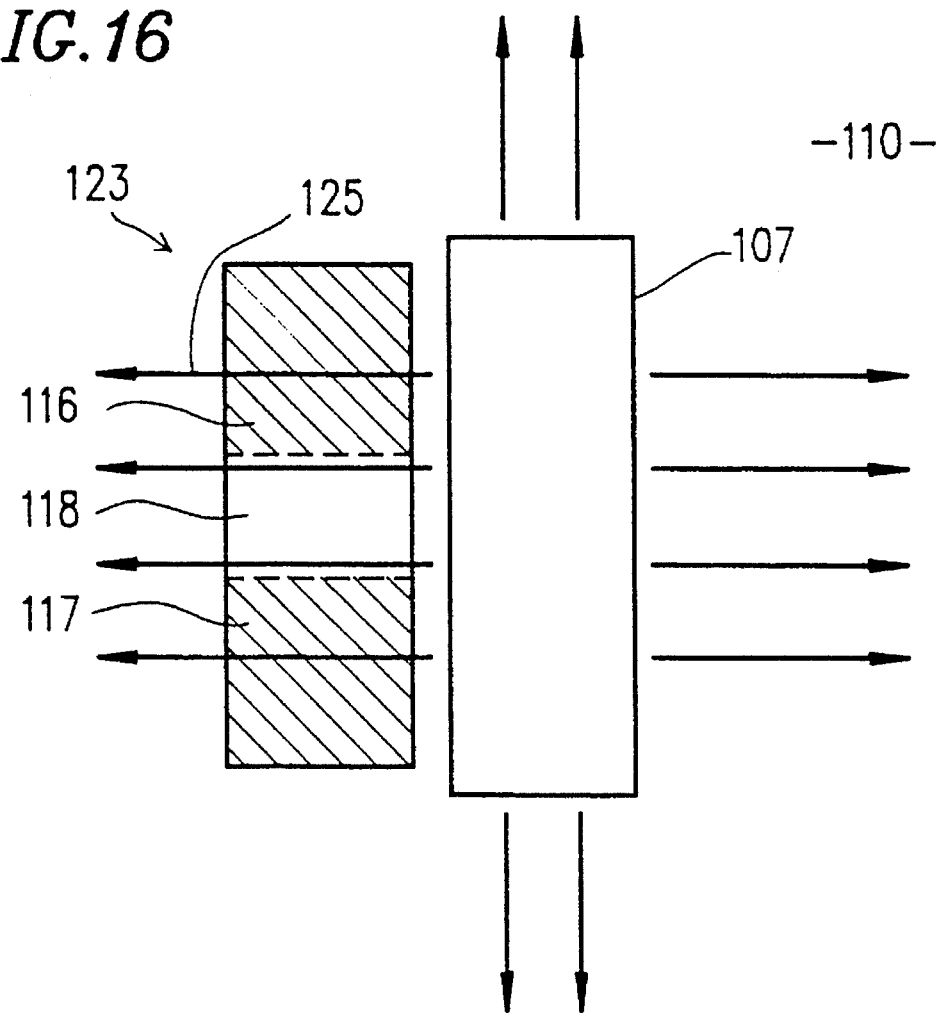

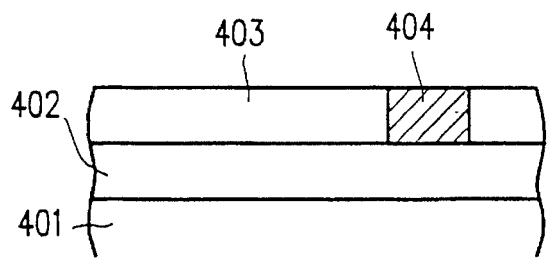
FIG.19A
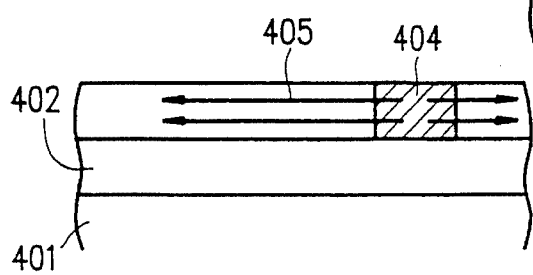
FIG.19B
FIG.19C
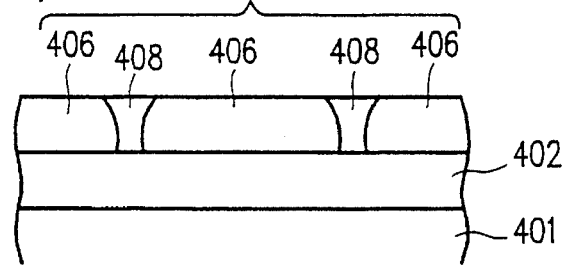
FIG.19D
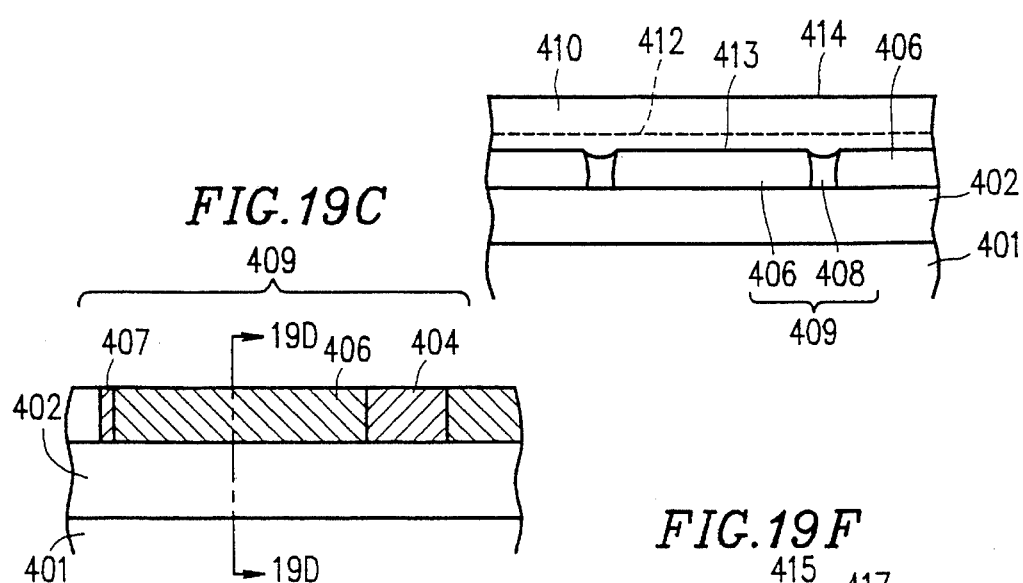
FIG.19E
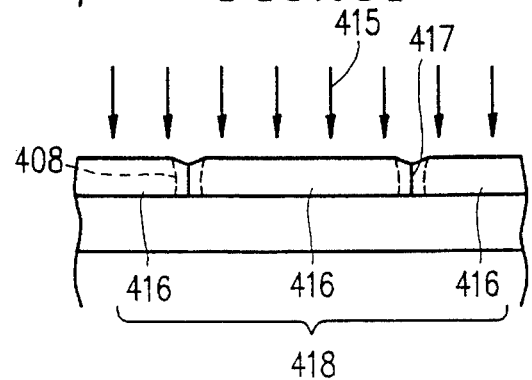
FIG.19F

METHOD FOR PRODUCING CRYSTALLINE SEMICONDUCTOR FILM HAVING REDUCED CONCENTRATION OF CATALYST ELEMENTS FOR CRYSTALLIZATION AND SEMICONDUCTOR DEVICE HAVING THE SAME

BACKGROUND OF THE INVENTION

1. Field of the Invention

The present invention relates to a method for producing a semiconductor film and a semiconductor device having the semiconductor film. In particular, the present invention relates to a method for producing a semiconductor film and a thin film transistor used for an active matrix type liquid crystal display device, an image sensor, and the like.

2. Description of the Related Art

Active matrix type liquid crystal display devices and the like use thin film transistors (TFTs) for driving pixels provided therein. Each TFT generally includes a silicon semiconductor film formed on an insulating substrate made of glass or the like; therefore, the characteristics of the TFT greatly depend upon those of the silicon semiconductor film.

A silicon semiconductor film falls roughly into two categories: an amorphous silicon (a-Si) semiconductor film and a crystalline silicon semiconductor film.

The amorphous silicon semiconductor film has generally been used, since it can be relatively easily produced by a vapor phase method at lower temperatures. In spite of this mass-productivity of the amorphous silicon semiconductor film, the physical properties thereof, such as conductivity, are inferior to those of the crystalline silicon semiconductor film. Thus, in order to obtain a silicon semiconductor film provided with higher electron-mobility, there has been strong demand for the establishment of a method for producing a TFT made of a crystalline silicon semiconductor film.

Examples of the material used for the crystalline silicon semiconductor film include polycrystalline silicon, micro-crystalline silicon, amorphous silicon containing a crystalline component, and semi-amorphous silicon having an intermediate state between crystallinity and non-crystallinity. As a method for obtaining a thin film shaped silicon semiconductor having these crystallinities, the following three methods are known.

(1) A crystalline silicon semiconductor film is directly formed.

(2) An amorphous silicon film is formed, and then is crystallized by the irradiation of a laser beam or the like.

(3) An amorphous silicon film is formed, and then is crystallized with heat energy.

These methods have the following problems.

According to method (1), the film is crystallized while being formed. For this reason, a silicon film with large thickness is required to be formed so as to obtain crystalline silicon with a large particle size. However, it is technologically difficult to uniformly form a film having satisfactory semiconductor physical properties over an entire surface of a substrate. Furthermore, in this case, a temperature for forming the film is 600° C. or higher, causing a problem in terms of cost, that is, the impossibility of using an inexpensive glass substrate having a low softening point.

According to method (2), a crystallization phenomenon is utilized in a process during which a film is changed from a liquid state to a solid state; therefore, the grain boundaries are satisfactorily treated even though the particle size of the crystal is small. Thus, a crystalline silicon film of high quality can be obtained. In spite of this advantage, in the case of an excimer laser which has generally been used, an area to be irradiated with a laser beam is small, so that throughput is low. In addition, the stability of the excimer laser is not sufficient for uniformly treating the entire surface of a large substrate.

Method (3) has an advantage of being applied to a large area, unlike methods (1) and (2). However, method (3) requires heat treatment at a high temperature of 600° C. or more over tens of hours during crystallization. Thus, in order to use an inexpensive glass substrate and improve throughput, it is required to lower a heating temperature and crystallize the film for a short period of time. In addition, since method (3) utilizes a solid phase crystallization phenomenon, crystal particles are grown by spreading in parallel with the substrate surface to form particles having a particle size of several μm, and crystal particles thus grown come into contact with each other to form grain boundaries. These grain boundaries become lattice defects and work as a trap level trapping carriers, causing a great decrease in electron-mobility of TFTs.

In order to solve the above-mentioned problems of the crystal particle boundaries in method (3), the following two methods (4) and (5) have been proposed.

According to method (4), impurities such as silicon ($Si^+$) are introduced by an ion implantation method or the like, and then a polycrystalline silicon film having a crystal particle size of several μm is obtained by heat treatment (Japanese Laid-Open Patent Publication No. 5-55142).

According to method (5), silicon particles having a particle size of 10 to 100 nm are sprayed onto an amorphous silicon film together with high-pressure nitrogen gas to form growth cores (Japanese Laid-Open Patent Publication No. 5-136048).

In both of methods (4) and (5), foreign particles which are to become growth cores of crystal are selectively introduced into a predetermined region of the amorphous silicon film, and then crystal growth is allowed to be effected using the foreign particles as the cores by heat treatment to obtain a crystalline silicon film of high quality having a large particle size. Accordingly, a semiconductor device such as a TFT is produced by utilizing the crystalline silicon film thus obtained.

However, according to methods (4) and (5), the introduced foreign particles work only as crystal cores. Therefore, although the foreign particles are effective for the generation of crystal cores and the control of a crystal growth direction, the above-mentioned problems in the step of heat treatment for crystallization remains unresolved. For example, in method (4), the crystallization of the film is effected by heat treatment at 600° C. for 40 hours, and in method (5), the crystallization of the film is effected by heat treatment at 650° C. or higher. Both of these methods (4) and (5) use such a high temperature for heat treatment, so that these methods are effective for an SOI substrate and an SOS substrate but are not appropriate for the application to an inexpensive glass substrate. For example, glass of Corning 7059 used for an active matrix type liquid crystal display device has a glass strain point of 593° C. Therefore, when the liquid crystal display device having a large area is produced by using this glass as a substrate, heating at 600° C. or higher causes strain of the substrate.

The present invention overcomes the above-mentioned conventional problems, and its objective is to provide a method for producing a crystalline silicon film, in which the crystallization is accelerated by heat treatment at low temperature for a short period of time and the effect of the crystal boundaries is reduced. More specifically, the objective of the present invention is to provide a method for uniformly producing a semiconductor thin film having crystallinity on the surface of the substrate by effecting the crystallization at a temperature of 600° C. or lower for a short period of time. Furthermore, according to the present invention, crystallinity higher than that obtained by a conventional heat treatment is obtained, and the concentration of catalytic elements contained in a semiconductor thin film having crystallinity is reduced, thereby providing a method for producing a semiconductor film of high performance which is excellent in reliability and electrical stability and a method for producing a semiconductor device using such a semiconductor film.

SUMMARY OF THE INVENTION

The method for producing a semiconductor film of this invention, includes the steps of:

(a) forming an amorphous semiconductor film on a substrate having a surface with an insulating property;

(b) introducing a material for accelerating crystallization of the amorphous semiconductor film into at least a part of the amorphous semiconductor film;

(c) crystallizing the amorphous semiconductor film by heating to obtain a crystalline semiconductor film from the amorphous semiconductor film; and (d) oxidizing a surface of the crystalline semiconductor film to form a semiconductor oxide film containing a part of the material for accelerating the crystallization on the surface of the crystalline semiconductor film.

In one embodiment of the invention, the above-mentioned method further includes a step (e) of irradiating high energy light to the crystalline semiconductor film after the step (d).

In another embodiment of the invention, the above-mentioned method further includes the step of removing the semiconductor oxide film.

In still another embodiment of the invention, the above-mentioned method further includes the step of removing the semiconductor oxide film after one of the steps (d) and (e).

In still another embodiment of the invention, during the step (b), the material for accelerating the crystallization of the amorphous semiconductor film is introduced into the amorphous semiconductor film from an entire surface thereof.

In still another embodiment of the invention, a crystal growth direction of the crystalline semiconductor film is substantially parallel with the substrate.

In still another embodiment of the invention, during the step (d), the crystalline semiconductor film is heated in an atmosphere containing at least oxygen or water vapor.

In still another embodiment of the invention, during the step (d), the crystalline semiconductor film is heated in the atmosphere further containing one selected from the group consisting of nitric acid gas, halogen, and hydrogen halide.

In still another embodiment of the invention, the crystalline semiconductor film is heated in the atmosphere at a temperature of 650° C. or lower.

In still another embodiment of the invention, during the step (d), the crystalline semiconductor film is heated in the atmosphere kept at a pressure of about 25 atm.

In still another embodiment of the invention, during the step (d), the crystalline semiconductor film is heated in the atmosphere in a plasma state.

In still another embodiment of the invention, during the step (d), the crystalline semiconductor film is heated in the atmosphere with being irradiated while UV-rays.

In still another embodiment of the invention, during the step (d), the crystalline semiconductor film is dipped into a solution containing ions selected from the group consisting of sulfuric acid ions, nitric acid ions, nitrous acid ions, permanganate ions, chromic acid ions, chlorine ions, and hypochlorous acid ions.

In still another embodiment of the invention, the material for accelerating the crystallization contains one selected from the group consisting of Ni, Co, Pd, Pt, Fe, Cu, Ag, Au, In, Sn, P, As, and Sb.

Alternatively, a method for producing a semiconductor device of this invention, includes the steps of:

(a) forming an amorphous semiconductor film on a substrate having a surface with an insulating property;

(b) introducing a material for accelerating crystallization of the amorphous semiconductor film into at least a part of the amorphous semiconductor film;

(c) crystallizing the amorphous semiconductor film by heating to obtain a crystalline semiconductor film from the amorphous semiconductor film;

(d) oxidizing a surface of the crystalline semiconductor film to form a semiconductor oxide film containing a part of the material for accelerating the crystallization on the surface of the crystalline semiconductor film; and (e) providing a semiconductor device region in the crystalline semiconductor film.

In one embodiment of the invention, the above-mentioned method further includes the step (f) of irradiating high energy light to the crystalline semiconductor film between the step (d) and the step (e).

In another embodiment of the invention, the above-mentioned method further includes the step of removing the semiconductor oxide film after the step (d).

In still another embodiment of the invention, the above-mentioned method further includes the step of removing the semiconductor oxide film after one of the steps (d) and (f).

In still another embodiment of the invention, a crystal growth direction of the crystalline semiconductor film is substantially parallel with the substrate.

In still another embodiment of the invention, in the semiconductor device region, a direction in which carriers in the crystalline semiconductor film move is substantially parallel with the crystal growth direction of the crystalline semiconductor film.

In still another embodiment of the invention, in the semiconductor device region, a direction in which carriers in the crystalline semiconductor film move is substantially vertical to the crystal growth direction of the crystalline semiconductor film.

In still another embodiment of the invention, the semiconductor device further has a channel in the semiconductor device region, and the channel is at least provided in a region other than the part of the crystalline semiconductor film into which the material for accelerating crystallization of the amorphous semiconductor film is introduced.

In still another embodiment of the invention, during the step (b), the material for accelerating the crystallization of the amorphous semiconductor film is introduced into the amorphous semiconductor film from an entire surface thereof.

In still another embodiment of the invention, during the step (d), the crystalline semiconductor film is heated in an atmosphere containing at least oxygen or water vapor.

In still another embodiment of the invention, during the step (d), the crystalline semiconductor film is heated in the atmosphere further containing one selected from the group consisting of nitric acid gas, halogen, and hydrogen halide.

In still another embodiment of the invention, the crystalline semiconductor film is heated in the atmosphere at a temperature of 650° C. or lower.

In still another embodiment of the invention, during the step (d), the crystalline semiconductor film is heated in the atmosphere kept at a pressure of about 25 atm.

In still another embodiment of the invention, during the step (d), the crystalline semiconductor film is heated in the atmosphere in a plasma state.

In still another embodiment of the invention, during the step (d), the crystalline semiconductor film is heated in the atmosphere with being irradiated with UV-rays.

In still another embodiment of the invention, during the step (d), the crystalline semiconductor film is dipped into a solution containing ions selected from the group consisting of sulfuric acid ions, nitric acid ions, nitrous acid ions, permanganate ions, chromic acid ions, chlorine ions, and hypochlorous acid ions.

In still another embodiment of the invention, the material for accelerating the crystallization contains one selected from the group consisting of Ni, Co, Pd, Pt, Fe, Cu, Ag, Au, In, Sn, P, As, and Sb.

According to the present invention, a material for accelerating the crystallization of an amorphous semiconductor is introduced into an amorphous semiconductor film formed on an insulating substrate or a substrate having an insulating film on its surface and heated. Crystals of the amorphous semiconductor are grown by the catalytic effect of the material for accelerating the crystallization, and a light beam with high energy is irradiated to the crystallized semiconductor film to treat crystal grain boundaries, whereby the crystallization is accelerated. Between these steps, the surface of the crystallized semiconductor film is oxidized, and thus, the concentration of the catalytic material in the crystallized semiconductor film can be reduced.

In the case where nickel is introduced into the amorphous silicon film, crystal cores are formed in a nickel-introduced region to cause the crystallization of the amorphous silicon film. Thereafter, the crystallization proceeds toward a peripheral nickel non-introduced region in a radial shape with respect to the respective crystal cores along the substrate surface. Hereinafter, the crystal growth region along the substrate surface is referred to as a lateral growth region.

It is considered that nickel moves in the amorphous silicon film while showing a catalytic effect for forming a silicon-silicon bond at a nickel-silicon bond portion, and a region where the concentration of nickel is high is always positioned in a crystal growth end. In the lateral growth region, the crystal structure has a needle shape or a column shape; however, since nickel moves from a crystal portion to an amorphous portion, nickel is present in the grain boundary between the respective needle-shaped crystals or column-shaped crystals. The grain boundaries where the concentration of nickel is high allow a current to pass therethrough. This causes the deterioration of the OFF characteristics, and problems in reliability and electrical stability of a produced TFT. The regions where the concentration of the catalytic element is high are distributed in a catalytic element introduced region, an amorphous silicon portion in the vicinity of the silicon crystal growth end, and in the vicinity of crystal grain boundaries between the respective crystals.

Then, the surface of the silicon film, which is crystallized by the introduction of the catalytic element for accelerating the crystallization, is oxidized. As a result, the crystal growth end and the crystal grain boundary are oxidized faster than the crystal portion. The crystal growth end and the crystal grain boundary have a high concentration of the catalytic element. Therefore, an oxide film containing the catalytic element is formed in these portions, and the catalytic element is removed together with the oxide film by etching conducted later. As a result, the concentration of the catalytic element in the crystallized silicon film can be remarkably reduced. Furthermore, by applying such a procedure to the crystallized silicon substrate, surface contaminants, which will deteriorate the characteristics of the TFT, such as an organic substance adhering to the surface of the crystallized silicon film can be purified simultaneously.

Thereafter, the crystalline silicon film is irradiated with a laser beam or a strong beam. The crystal grain boundaries can be concentratedly treated because of the difference between the melting point of the crystalline silicon film and that of the amorphous silicon film. At this time, the crystalline silicon film formed by a conventional solid phase growth method has a twin crystal structure, so that twin crystal defects remain in the crystal grain boundaries even after the irradiation of a laser beam. On the other hand, the crystalline silicon film crystallized by the introduction of the catalytic element is made of needle-shaped crystals or column-shaped crystals, and the inside thereof has a single crystal state. Therefore, when the crystal grain boundaries are treated with a laser beam or a strong beam, a crystalline silicon film having a property almost close to that of single crystal can be obtained over the entre surface of the substrate.

Thus, the invention described herein makes possible at least one of the following advantages:

(1) A catalytic element for accelerating crystallization is introduced to crystallize an amorphous film, so that a crystalline semiconductor film can be produced by a treatment at a low temperature of about 550° C. for a short period of time. At this time, the crystal growth direction can be controlled by selectively introducing the catalytic element.

(2) The surface of the crystallized semiconductor film is oxidized to reduce the concentration of the catalytic element, whereby the contaminants on the film surface can be simultaneously removed.

(3) By irradiating a light beam with high energy to the surface of the semiconductor film to treat the crystal grain boundaries, a satisfactory crystalline semiconductor film having a property close to that of single crystal can be obtained.

(4) When a TFT is produced by using the crystalline semiconductor film, the TFT can have a large ON/OFF ratio, a low leakage of a current, high electron-mobility, excellent reliability, and electrical stability.

(5) The highest process temperature is controlled to about 600° C. and the crystallization time can be shortened, so that a sheet glass having a strain point of about 650° C. can be used as a substrate. This makes possible the mass-production of a driver monolithic large screen liquid crystal display device of direct-view-type.

These and other advantages of the present invention will become apparent to those skilled in the art upon reading and understanding the following detailed description with reference to the accompanying figures.

BRIEF DESCRIPTION OF THE DRAWINGS

FIG. 1 is a cross-sectional view illustrating a method for producing a TFT of Example 1 according to the present invention.

FIG. 2 is a cross-sectional view illustrating a method for producing the TFT of Example 1 according to the present invention.

FIG. 3 is a cross-sectional view illustrating a method for producing the TFT of Example 1 according to the present invention.

FIG. 4 is a cross-sectional view illustrating a method for producing the TFT of Example 1 according to the present invention.

FIG. 16 is a plan view showing another positioning of the TFT of Example 1 according to the present invention.

FIGS. 19A through 19F are respectively cross-sectional views illustrating a method for producing a semiconductor film of Example 4 according to the present invention.

DESCRIPTION OF THE PREFERRED EMBODIMENTS

Figure 5:
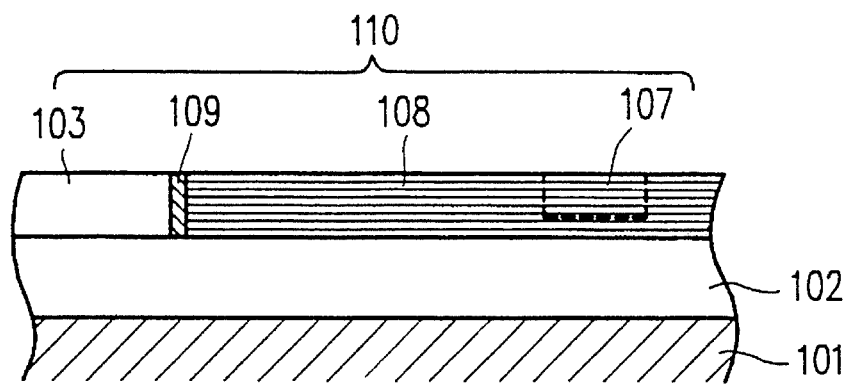
FIG. 5 is a cross-sectional view illustrating a method for producing the TFT of Example 1 according to the present invention.

Hereinafter, the present invention will be described by way of illustrative examples with reference to the accompanying drawings. It should be noted that the present invention is not limited to the following examples.

EXAMPLE 1

As shown in FIG. 1, the surface of a substrate 101 made of glass or the like is washed and then, a base coat film 102 made of silicon dioxide ($SiO_2$) is formed on the substrate 101 so as to have a thickness of about 200 nm by using a sputtering apparatus. In the case where the surface of the substrate 101 is sufficiently flat, and the concentration of a material adversely affecting the semiconductor characteristics, such as Na ions, in the substrate 101 is sufficiently low, the thickness of the base coat film 102 may be smaller than 200 nm or may be omitted. On the other hand, in the case where the surface of the substrate 101 is rough, it is preferred that a base coat film 102 having a thickness of 200 nm or more is provided. Furthermore, in the case of providing the base coat film 102, the substrate 101 may not have an insulating property.

An amorphous silicon film 103 is formed so as to have a thickness of about 100 nm by chemical vapor deposition (CVD) or sputtering. It is preferred that the amorphous silicon film 103 has a thickness in the range of 20 to 150 nm.

As shown in FIG. 2, a mask layer 104 is formed on the amorphous silicon film 103 by a sputtering apparatus or the like. The mask layer 104 is made of $SiO_2$ or the like and has a thickness of 100 nm or more. An opening 105 is patterned in the mask layer 104. Nickel 106 is introduced into a region 107 of the amorphous silicon film 103 as a material for accelerating the crystallization of the amorphous silicon film 103, using the mask layer 104 having the opening 105 as a mask.

Then, as shown in FIG. 3, the mask layer 104 is removed by etching. Thereafter, the entire substrate 101 including the amorphous silicon film 103 is heated to about 550° C. The heating temperature may be in the range of 500° C. to 580° C. About 3 to 10 minutes after the onset of heating, the nickel 106 catalyzes the formation of silicon crystal cores to cause the crystallization of the amorphous silicon film 103 in the region 107 of the amorphous silicon film 103. As a result, the amorphous silicon contained in the region 107 becomes crystalline silicon. Thereafter, as represented by arrows of FIG. 3, the crystallization proceeds from the region 107 in a radial shape along the surface of the substrate 101 toward a region where nickel 106 is not introduced.

As shown in FIGS. 4 and 5, the crystallization of the amorphous silicon film 103 proceeds in a direction parallel with the surface of the substrate 101 to form a crystalline silicon region 108 including the region 107. The crystalline silicon region 108 is made of a plurality of needle-shaped or column-shaped silicon crystals having a growth direction in parallel with the surface of the substrate 101. Each needle-shaped or column-shaped silicon crystal is an ideal single crystal. In the tip end portion of the growth direction of the crystalline silicon region 108, a high-concentration nickel region 109 is present at all times. The amorphous silicon is crystallized in this portion. Furthermore, in grain boundaries of a plurality of needle-shaped or column-shaped silicon crystals, the nickel 106 is accumulated. Particularly in a portion of the region 107 where the nickel 106 is first introduced, the concentration of the nickel 106 is high. The nickel 106 allows a current to pass therethrough, so that the electrical characteristics of the crystalline silicon region 108 are degraded. During this step, a crystalline silicon film 110 having the crystalline silicon region 108 is formed from the amorphous silicon film 103.

Figure 6:
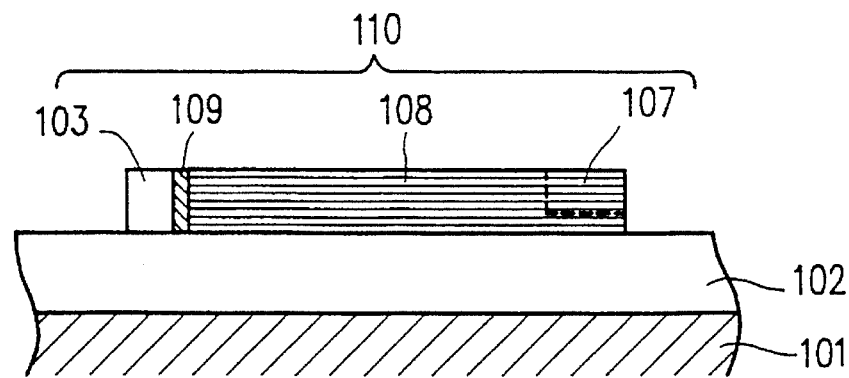
FIG. 6 is a cross-sectional view illustrating a method for producing the TFT of Example 1 according to the present invention.

Next, as shown in FIG. 6, the crystalline silicon region 108 is allowed to grow sufficiently for producing a semiconductor device, and a crystalline silicon film 110 including the crystalline silicon region 108 is patterned to an island shape. At this time, the amorphous silicon film 103, the high-concentration nickel region 109, and the region 107 containing nickel in large concentrations may be contained in the island. The crystalline silicon region 108 having a size sufficient for producing a semiconductor device is formed by heating for about 4 to 8 hours.

Figure 7:
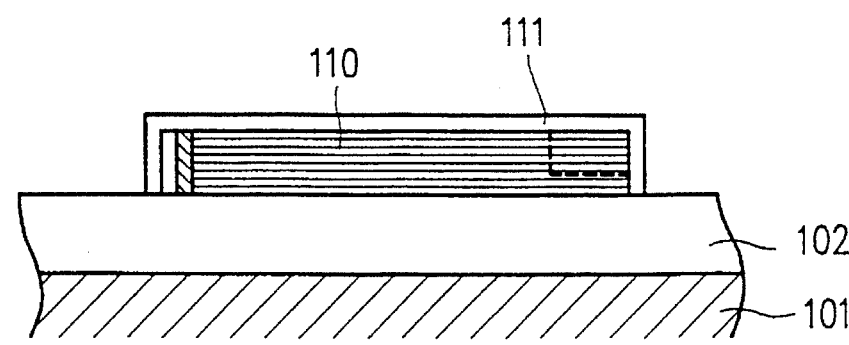
FIG. 7 is a cross-sectional view illustrating a method for producing the TFT of Example 1 according to the present invention.
Figure 8:
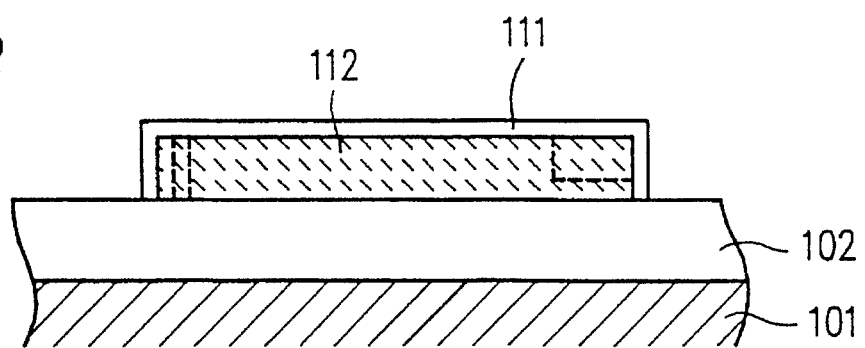
FIG. 8 is a cross-sectional view illustrating a method for producing the TFT of Example 1 according to the present invention.

As shown in FIG. 7, the surface of the crystalline silicon film 110 is oxidized. More specifically, the substrate 101 is kept in a heat annealing furnace equipped with heating facilities and a quartz tube. Then, a nitrogen gas ($N_2$), an oxygen gas ($O_2$), and a hydrogen chloride gas (HCl) are introduced into the quartz tube, and the substrate 101 is heat-treated at a temperature of 650° C. or lower, preferably in the range of 550° C. to 600° C. for 1 to 12 hours, whereby a silicon oxide film 111 is formed on the surface of the crystalline silicon film 110. The silicon oxide film 111 preferably has a thickness in the range of 10 nm to 30 nm. In the crystalline silicon film 110, the grain boundaries of the silicon crystal portions contain nickel in large concentrations and are more readily oxidized, compared with the silicon crystal portions. The selective oxidation of the grain boundaries results in a high-concentration of nickel in the silicon oxide film 111. Then, as shown in FIG. 8, the concentration of nickel in the crystalline silicon film 110 is decreased, providing a crystalline silicon film 112 in which the concentration of nickel is decreased. Simultaneously, impurities such as organic substances adhering to the surface of the crystalline silicon film 110 are oxidized to be taken in the silicon oxide film 111 or burnt up.

Figure 9:
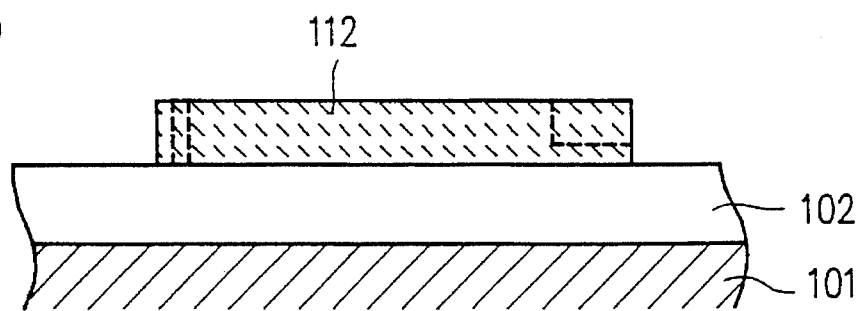
FIG. 9 is a cross-sectional view illustrating a method for producing the TFT of Example 1 according to the present invention.

Thereafter, as shown in FIG. 9, the silicon oxide film 111 is removed to obtain the crystalline silicon film 112 above the substrate 101.

Hereinafter, a process for producing a TFT by using the crystalline silicon film 112 thus obtained will be described.

Figure 10:
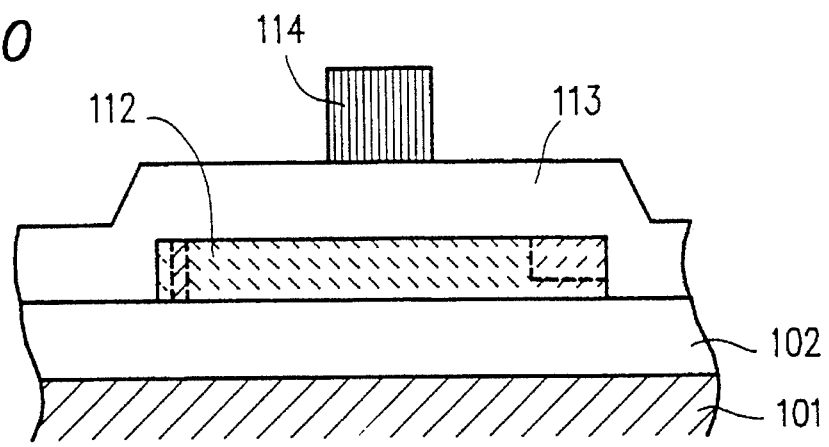
FIG. 10 is a cross-sectional view illustrating a method for producing the TFT of Example 1 according to the present invention.
Figure 11:
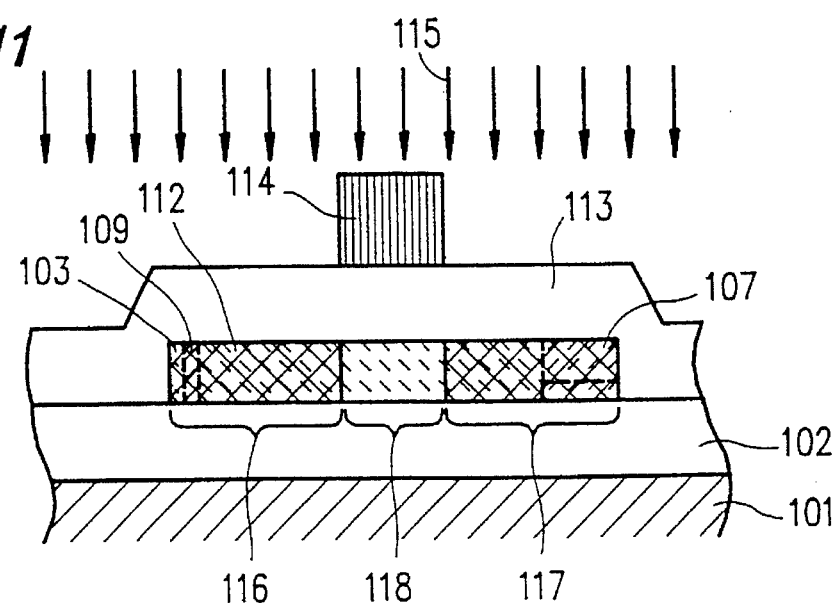
FIG. 11 is a cross-sectional view illustrating a method for producing the TFT of Example 1 according to the present invention.

As shown in FIG. 10, a gate insulating film 113 is formed on the crystalline silicon film 112, and a gate electrode 114 is formed on the gate insulating film 113. As shown in FIG. 11, impurity ions 115 to be donors or acceptors are implanted into the crystalline silicon film 112 through the gate insulating film 113, using the gate electrode 114 as a mask. Furthermore, the implanted impurity ions 115 are activated. As a result of the ion implantation, a source region 116 and a drain region 117 are formed in the crystalline silicon film 112, and a channel region 118 in which the impurity ions are not implanted is formed below the gate electrode 114. As described with reference to FIG. 6, in the case where the amorphous silicon film 103, the high-concentration nickel region 109, and the region 107 containing nickel in large concentrations are included in the crystalline silicon film 112, it is required to design a TFT to be produced so that these regions are not included in the channel region 118, but included in the source region 116 and the drain region 117.

Figure 12:
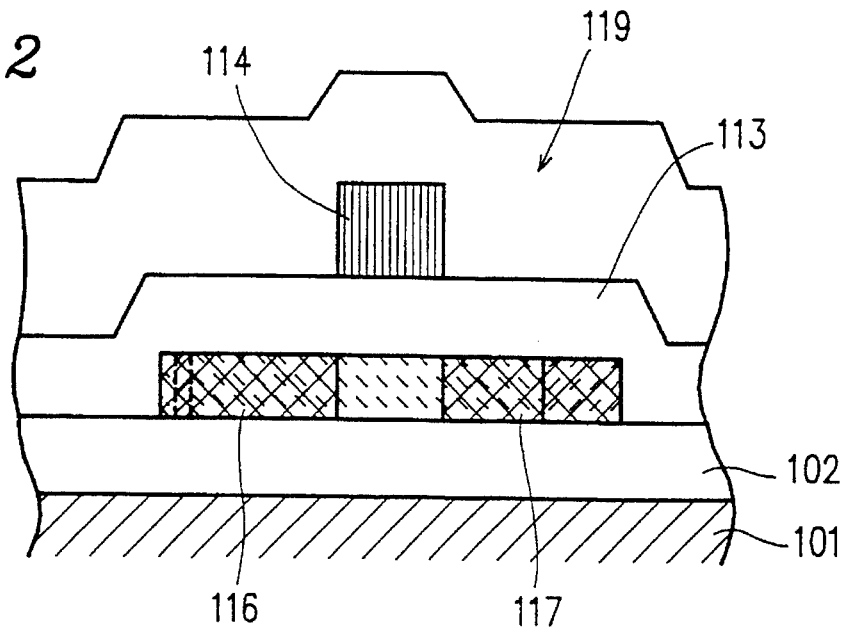
FIG. 12 is a cross-sectional view illustrating a method for producing the TFT of Example 1 according to the present invention.
Figure 13:
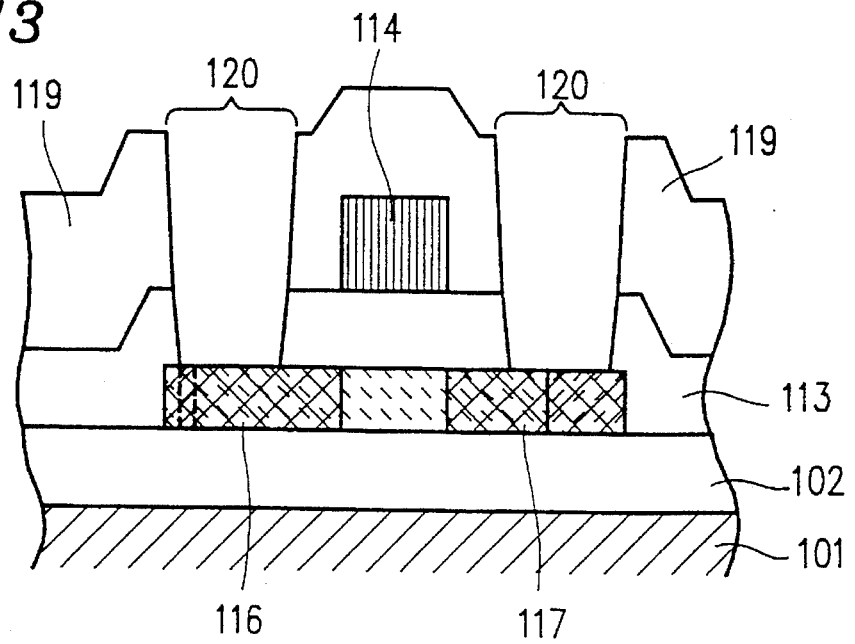
FIG. 13 is a cross-sectional view illustrating a method for producing the TFT of Example 1 according to the present invention.
Figure 14:
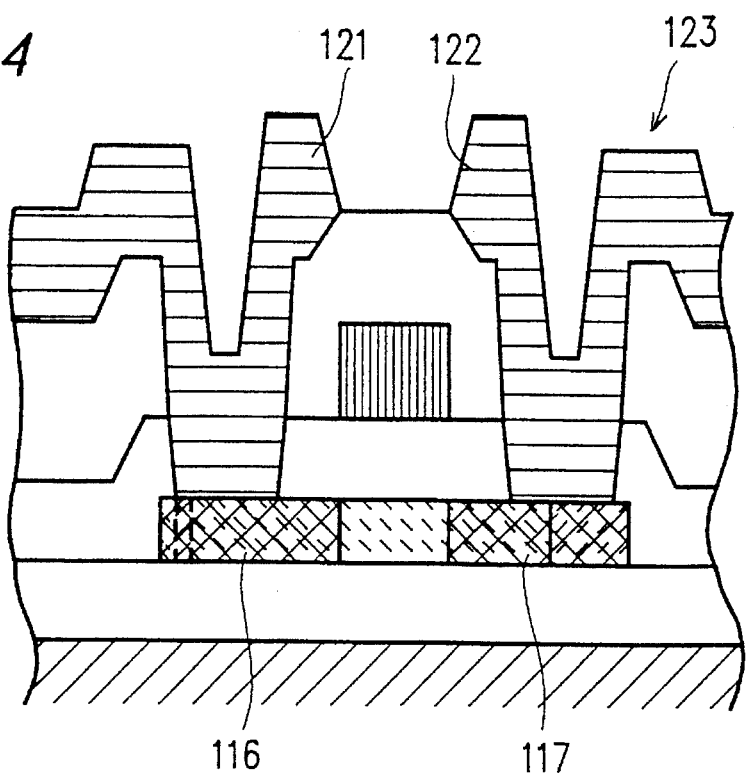
FIG. 14 is a cross-sectional view illustrating a method for producing the TFT of Example 1 according to the present invention.

As shown in FIGS. 12 and 13, an interlayer insulator 119 is formed so as to cover the gate electrode 114 and the gate insulating film 113, and contact holes 120 are formed in the interlayer insulator 119 and the gate insulating film 113 so as to reach the source region 116 and the drain region 117. Then, as shown in FIG. 14, a source electrode 121 and a drain electrode 122 electrically connected to the source region 116 and the drain region 117, respectively, are formed to complete a TFT 123.

Figure 15:
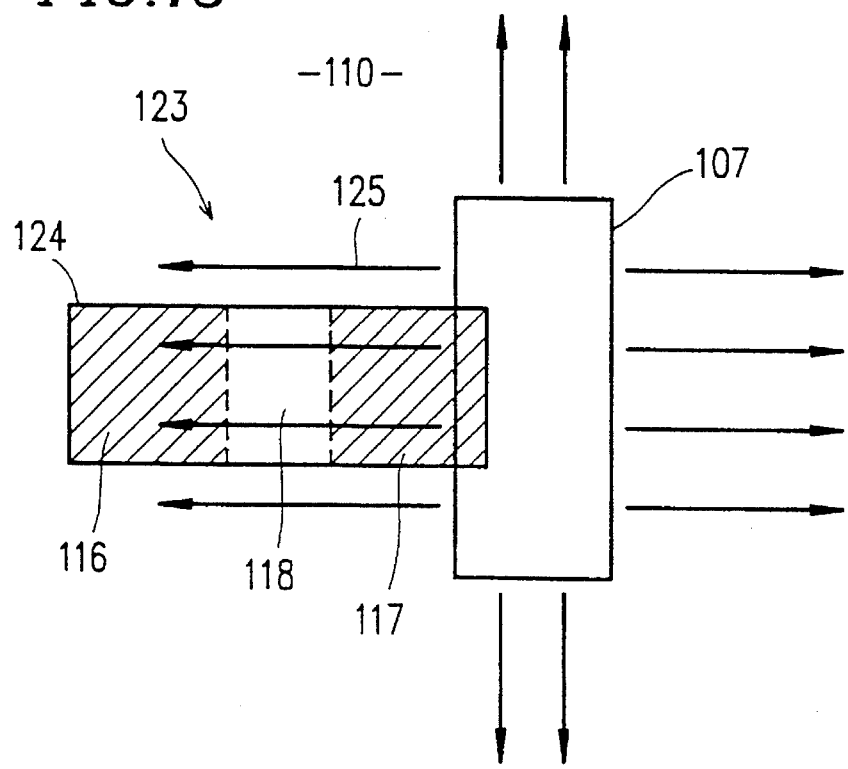
FIG. 15 is a plan view showing the positioning of the TFT of Example 1 according to the present invention.

FIG. 15 shows the positioning of the TFT 123 produced as described above in the crystalline silicon film 110. Actually, the crystalline silicon film 110 is separated in an island shape as a region 124 of the TFT 123 before the completion thereof, and the crystalline silicon film 110 positioned in regions other than the region 124 is removed.

As shown in FIG. 15, in the crystalline silicon film 110, the needle-shaped or column-shaped silicon crystals grow in a direction represented by an arrow 125, and in each needle-shaped or column-shaped silicon crystal, no grain boundaries are present in the direction 125. Thus, by matching the direction, in which the carriers of the TFT 123 move, with the growth direction of the crystals, a channel having no grain boundaries in the carrier moving direction can be obtained. As a result, the TFT 123 will have high electron mobility. Furthermore, during the steps of forming and removing the above-mentioned silicon oxide film 111, nickel is almost removed from the crystal grain boundaries between the respective needle-shaped or column-shaped silicon crystals, so that a leak current flowing between the needle-shaped or column-shaped crystals becomes less. When a TFT is produced by using such a crystalline silicon film as an active region, the electric field effect mobility is increased by about 1.2 times, compared with the case where a crystalline silicon film is formed by a conventional solid phase growth method.

As shown in FIG. 16, when the TFT 123 is positioned in the crystalline silicon film 110 so that the direction in which the carriers of the TFT 123 move is vertical to the direction 125, crystal grain boundaries will not be positioned in a portion between the drain region 117 and the channel 118 where the electric field is concentrated. As a result, an OFF current is reduced and a transistor having a large ON/OFF ratio can be obtained.

In the present example, the silicon oxide film 111 to be formed on the surface of the crystalline silicon film 110 can be formed by various methods other than those described above.

Hereinafter, other methods for forming the silicon oxide film 111 will be described.

Method (1)

The crystalline silicon film 110 shown in FIG. 6 formed by the step similar to that described above is kept in a heat annealing furnace equipped with heating facilities and a quartz tube. Water vapor, or water vapor and gas which does not react with the water vapor are introduced into the quartz tube, and the crystalline silicon film 110 is heat-treated at a temperature of 650° C. or lower, preferably in the range of 550° C. to 600° C. for 1 to 12 hours, whereby the silicon oxide film 111 is formed on the surface of the crystalline silicon film 110.

Method (2)

In a tank made of quartz, an aqueous solution of oxoacid such as nitric acid, nitrous acid, permanganic acid, chromic acid, perchloric acid, and hypochlorous acid, or oxoacid salts such as nitrate, nitrite, permanganate, chromate, perchlorate, and hypochlorite is prepared and kept at room temperature of 150° C. or lower by using a heater. The crystalline silicon film 110 shown in FIG. 6 produced by the same process as the above is dipped in this solution to form the silicon oxide film 111 on the surface of the crystalline silicon film 110.

Method (3)

In a tank made of quartz, concentrated sulfuric acid is prepared and kept at room temperature of 150° C. or lower, preferably 130° C. or lower by using a heater. The crystalline silicon film 110 shown in FIG. 6 produced by the same process as the above is dipped in this solution to form the silicon oxide film 111 on the surface of the crystalline silicon film 110.

Method (4)

The crystalline silicon film 110 shown in FIG. 6 produced by the same process as the above is kept in a heat annealing furnace equipped with vacuum discharge facilities, heating facilities, and a quartz tube. Halogen gas such as chlorine and bromine and gas containing oxygen atoms of oxygen gas, dinitrogen oxide ($N_2O$), etc. is introduced into the quartz tube. The crystalline silicon film 110 is heat-treated at a temperature of 600° C. or lower, preferably in the range of 300° C. to 350° C. for 1 to 12 hours to form the silicon oxide film 111 on the surface of the crystalline silicon film 110.

Method (5)

The crystalline silicon film 110 shown in FIG. 6 produced by the same process as the above is prepared in a heat annealing furnace equipped with heating facilities and a quartz tube. Then, oxygen alone, or oxygen and gas which does not react with oxygen is introduced into the quartz tube and the crystalline silicon film 110 is heat-treated at a temperature of 650° C. or lower, preferably in the range of 550° C. to 600° C. for 1 to 12 hours to form the silicon oxide film 111 on the surface of the crystalline silicon film 110.

Method (6)

The crystalline silicon film 110 shown in FIG. 6 produced by the same process as that of the above is held in a chamber of a parallel plane type plasma chemical vapor deposition (CVD) device, an electron cyclotron resonance chemical vapor deposition (ECRCVD) device, or a microwave plasma CVD device. Oxygen is introduced into the chamber and kept at an appropriate pressure. The crystalline silicon film 110 is exposed to oxygen plasma at a temperature in the range of 300° C. to 350° C. for 5 minutes to one hour to form the silicon oxide film 111 on the surface of the crystalline silicon film 110.

Method (7)

The crystalline silicon film 110 shown in FIG. 6 produced by the same process as the above is held in a furnace of a high-pressure container. A high-pressure oxidation atmosphere at about 25 atm or a high-pressure heating water vapor at about 25 atm is introduced into the furnace. The crystalline silicon film 110 is heat-treated at a temperature of 650° C. or lower, preferably in the range of 550° C. to 600° C. for 1 to 12 hours to form the silicon oxide film 111 on the surface of the crystalline silicon film 110.

Method (8)

The crystalline silicon film 110 shown in FIG. 6 produced by the same process as the above is held in a heat annealing furnace equipped with vacuum discharge facilities, heating facilities, and a quartz tube. $N_2O$ gas is introduced into the quartz tube and is kept at a temperature in the range of 500° C. to 600° C., preferably 600° C., and the crystalline silicon film 110 is irradiated with UV-rays by a UV-ray lamp at ordinary pressure for 5 minutes to one hour, preferably about 30 minutes, thereby forming the silicon oxide film 111 on the surface of the crystalline silicon film 110.

According to the present example, it is considered that when the surface of the crystalline silicon film 110 is oxidized, the amorphous portions present in the grain boundaries of the silicon crystals are more selectively or readily oxidized, compared with the needle-shaped or column-shaped silicon crystals. The reasons for this are as follows:

When a silicon film containing amorphous silicon and crystalline silicon is subjected to Secco's etch with a mixed solution of potassium dichromate, nitric acid, and hydrofluoric acid for the purpose of observing the size of each crystal particle of the crystalline silicon, the amorphous portion is removed by etching to make it easy to observe the crystal particle of the crystalline silicon. In the mixed solution, potassium dichromate and nitric acid oxidize the silicon film by using a strong oxidation effect, and hydrofluoric acid removes the silicon film by etching. The amorphous portion is more readily oxidized and etched faster than the crystalline portion. Accordingly, it is generally known that the amorphous silicon is more readily oxidized than the crystalline silicon.

Thus, the material for accelerating the crystallization such as nickel, which is present in rich amounts in the amorphous portion of the crystal boundaries, is taken in the silicon oxide film and decreases the concentration of nickel in the crystallized silicon film.

EXAMPLE 2

FIGS. 17A through 17D are respectively cross-sectional views schematically showing a method for producing a semiconductor substrate of Example 2 according to the present invention.

In the same way as in Example 1, a crystalline silicon film having needle-shaped or column-shaped silicon crystal regions is formed. More specifically, the surface of a substrate 201 made of glass or the like is washed, and then $SiO_2$ is deposited to a thickness of about 200 nm by using a sputtering apparatus to form a base coat film 202. An amorphous silicon film (not shown) is deposited to a thickness of about 100 nm on the base coat film 202 by CVD or sputtering. The thickness of the amorphous silicon film is preferably in the range of 20 to 150 nm.

Figure 17A:
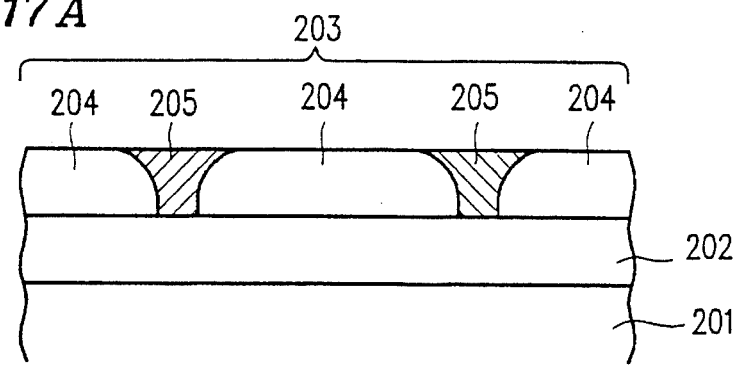
FIGS. 17A through 17D illustrate a method for producing a semiconductor film of Example 2 according to the present invention.

Nickel (not shown) is introduced into the amorphous silicon film as a catalytic element for accelerating the crystallization of the amorphous silicon film, and then the amorphous silicon film is heat-treated at a temperature of about 550° C. The heat treatment causes crystal cores to be formed in about 3 to 10 minutes. Thereafter, needle-shaped or column-shaped silicon crystals grow in a radial shape with respect to the respective crystal cores. FIG. 17A is a cross-sectional view in which the substrate 201 is cut in a direction traversing needle-shaped or column-shaped silicon crystal regions 204. The crystalline silicon film 203 includes needle-shaped or column-shaped silicon crystal regions 204 and amorphous silicon regions 205 present in crystal grain boundaries.

Nickel can be introduced into the amorphous silicon film by a method for diffusing Ni ions in the amorphous silicon film under the condition that a mask for direct or selective ion implantation is formed on the amorphous silicon film after forming a film with an Ni or Ni—Si compound by sputtering; a method for depositing Ni ions on the surface of the amorphous silicon film in a plasma chamber having an Ni electrode by plasma treatment and then diffusing Ni ions in the amorphous silicon film; or a method for implanting Ni ions into the amorphous silicon film by ion doping. In the case where a mask for selective implantation is not provided, nickel is introduced from the entire surface of the amorphous silicon film, and in the case where the mask for selective implantation is provided, nickel is introduced from a part of the surface of the amorphous silicon film. As long as an amorphous silicon film into which a catalytic element for accelerating the cryatallization can be formed, any methods for introducing nickel can be used.

Figure 17B:
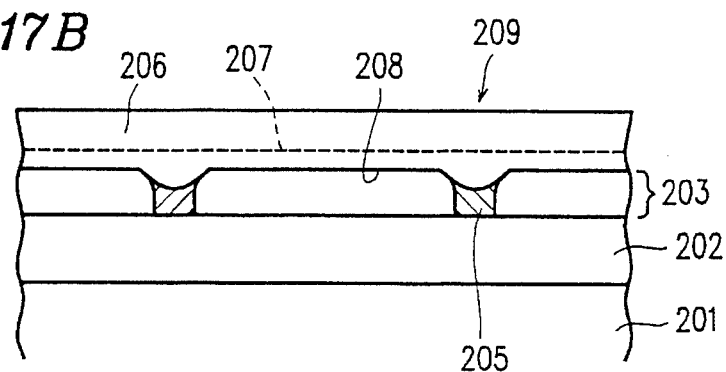

Next, as shown in FIG. 17B, the surface of the crystalline silicon film 203 is oxidized. Silicon increases in volume by oxidation. Therefore, a surface 209 of a formed silicon oxide film 206 is positioned higher from the substrate 201 than a surface 207 of the crystalline silicon film 203 before oxidation. The silicon oxide film 206 preferably has a thickness in the range of about 10 nm to about 30 nm. After the oxidation, the crystalline silicon film 203 has a surface 208. In the present example, thermal oxidation is conducted in an atmosphere of water vapor at 600° C. for 12 hours. The thermal oxidation decreases the thickness of the crystalline silicon film 203 by about 10 nm.

Since the amorphous silicon regions 205 are oxidized faster than the silicon crystal regions 204, the amorphous silicon regions 205 are oxidized deeper than the silicon crystal regions 204 on the interface between the crystalline silicon film 203 and the silicon oxide film 206 (i.e., the surface 208 of the crystalline silicon film 203). Furthermore, since the amorphous silicon region 205 having a high concentration of nickel is oxidized faster, the concentration of nickel contained in the crystalline silicon film 203 can be decreased. According to the results of a SIMS analysis, the concentration of nickel is decreased from about $1 \times 10^{19}$ atoms/cm$^3$ to $1 \times 10^{18}$ atoms/cm$^3$.

Figure 17C:
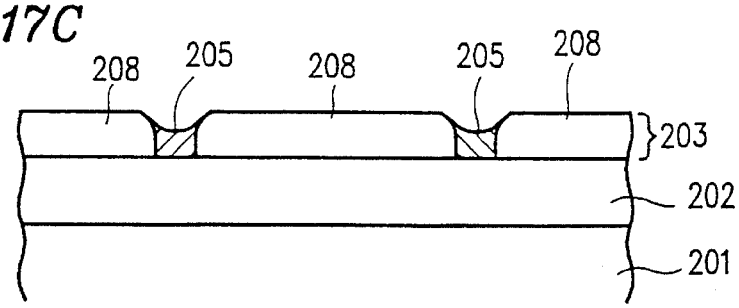

Thereafter, as shown in FIG. 17C, the silicon oxide film 206 is removed. At this time, nickel in the silicon oxide film 206 is removed. In addition, contaminants on the surface of the crystalline silicon film 203 can be simultaneously removed.

Figure 17D:
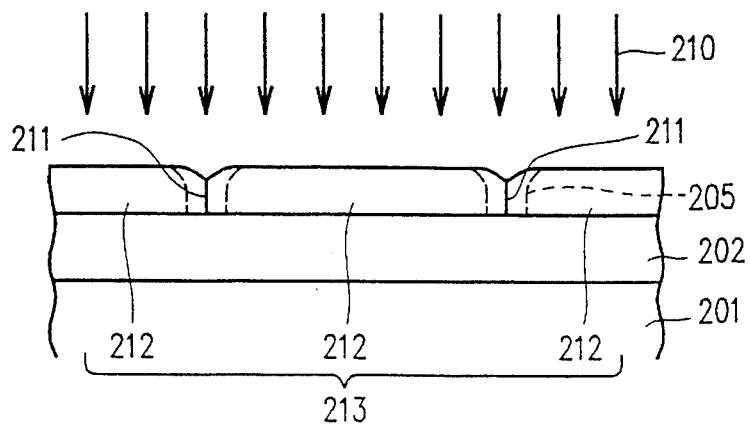

Next, as shown in FIG. 17D, an excimer laser beam 210 is irradiated to the crystalline silicon film 203 as high-energy light; as a result, the amorphous silicon regions 205 are taken in the crystals to form larger crystalline silicon regions 212. The amorphous silicon regions 205 disappear, and respective two adjacent crystalline silicon regions 212 form a crystal grain interface 211.

As described above, a polycrystalline silicon film having good uniformity and excellent electrical characteristics almost close to those of single crystal can be obtained. In the case where a TFT is produced by using the resulting polycrystalline silicon film, satisfactory characteristics as an n-type TFT such as 100 or more of electric field effect mobility and about 8 digits of ON/OFF ratio can be obtained.

In the present example, since the concentration of nickel contained in the crystalline silicon is reduced during the above-mentioned surface oxidation step, the nickel is not precipitated by the irradiation of a laser beam. Thus, the following problems can be prevented: The catalytic element is deposited on the silicon film surface by heat treatment, and a leak current is caused to flow through deposited metal between a source and a drain of a produced TFT.

In the case where the oxidation step is not conducted, it is required to remove the deposited catalytic element. The catalytic element is a silicon compound, so that the surface of the silicon film is damaged during the removal of the deposited catalytic element. This causes damage on the surface of the silicon film, which leads to the deterioration of the electron mobility caused by the damage and contact defects and causes problems in reliability and electrical stability. However, according to the present invention, such problems are not caused.

In the present example, nickel is exemplified as a catalytic element for accelerating the crystallization. Alternatively, at least one of Ni, Co, Pd, Pt, Fe, Cu, Ag, Au, In, Sn, P, As, and Sb may be used.

As a method for oxidizing the silicon film, other methods described in Example 1, such as thermal oxidation using HCl, halogen gas, or oxygen gas can be used.

As a light source for high energy light, an excimer laser is used; alternatively, other light sources such as a halogen lamp and a continuous wave laser may be used. The excimer laser has an advantage in that light with high energy density can be easily obtained. The halogen lamp has an advantage in that a process throughput is improved by simultaneously irradiating light to a large area.

EXAMPLE 3

FIGS. 18A through 18D are respectively a cross-sectional view schematically showing a method for producing a semiconductor substrate of Example 3 according to the present invention.

In the same way as in Example 1, a crystalline silicon film having needle-shaped or column-shaped crystal regions is formed. More specifically, the surface of a substrate 301 made of glass or the like is washed, and then SiO$_2$ is deposited to a thickness of about 200 nm by using a sputtering apparatus to form a base coat film 302. An amorphous silicon film (not shown) is deposited on the base coat film 302 by CVD or sputtering. The thickness of the amorphous silicon film is preferably in the range of 20 to 150 nm.

Figure 18A:
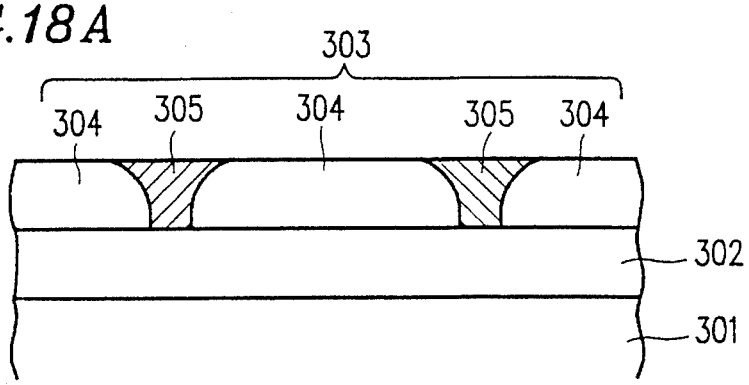
FIGS. 18A through 18D are respectively cross-sectional views illustrating a method for producing a semiconductor film of Example 3 according to the present invention.

Nickel (not shown) is introduced into the amorphous silicon film as a catalytic element for accelerating the crystallization of the amorphous silicon film, and then the amorphous silicon film is heat-treated at a temperature of about 550° C. The heat treatment causes crystal cores to be formed in about 3 to 10 minutes. Thereafter, needle-shaped or column-shaped silicon crystals grow in a radial shape with respect to the respective crystal cores. FIG. 18A is a cross-sectional view in which the substrate 301 is cut in a direction traversing the needle-shaped or column-shaped silicon crystal regions 304. The crystalline silicon film 303 includes needle-shaped or column-shaped silicon crystal regions 304 and amorphous silicon regions 305 present in crystal grain boundaries.

Nickel can be introduced into the amorphous silicon film by a method for diffusing Ni ions in the amorphous silicon film under the condition that a mask for direct or selective ion implantation is formed on the amorphous silicon film after forming a film with an Ni or Ni-Si compound by sputtering; a method for depositing Ni ions on the surface of the amorphous silicon film in a plasma chamber having an Ni electrode by plasma treatment, and then diffusing Ni ions in the amorphous silicon film; or a method for implanting Ni ions into the amorphous silicon film by ion doping. In the case where a mask for selective implantation is not provided, nickel is introduced from the entire surface of the amorphous silicon film, and in the case where the mask for selective implantation is provided, nickel is introduced from a part of the surface of the amorphous silicon film. As long as an amorphous silicon film into which a catalytic element for accelerating the cryatallization can be formed, any methods for introducing nickel can be used.

Figure 18B:
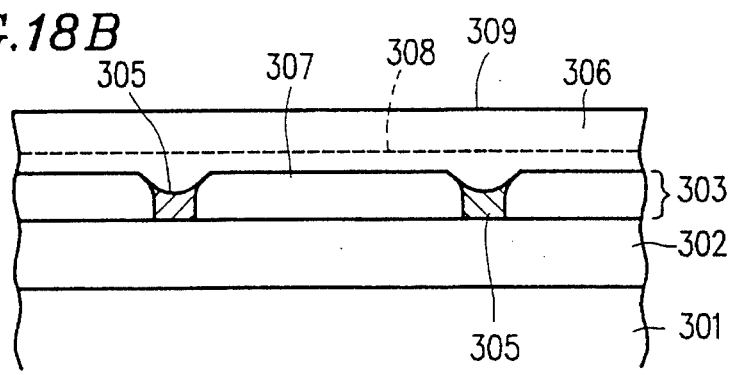

Next, as shown in FIG. 18B, the surface of the crystalline silicon film 303 is oxidized. Silicon increases in volume by oxidation. Therefore, a surface 309 of a formed silicon oxide film 306 is positioned higher from the substrate 301 than a surface 307 of the crystalline silicon film 303 before oxidation. The silicon oxide film 306 preferably has a thickness in the range of about 10 nm to about 30 nm. After the oxidation, the crystalline silicon film 303 has a surface 308. In the present example, thermal oxidation is conducted in an atmosphere of water vapor at 600° C. for 12 hours. The thermal oxidation decreases the thickness of the crystalline silicon film 303 by about 10 nm.

Since the amorphous silicon regions 305 are oxidized faster than the silicon crystal regions 304, the amorphous silicon regions 305 are oxidized deeper than the silicon crystal regions 304 on the interface between the crystalline silicon film 303 and the silicon oxide film 306 (i.e., the surface 308 of the crystalline silicon film 303). Furthermore, since the amorphous silicon regions 305 having a high concentration of nickel are oxidized faster, the concentration of nickel contained in the crystalline silicon film 303 can be decreased. According to the results of a SIMS analysis, the concentration of nickel is decreased from about $1 \times 10^{19}$ atoms/cm$^3$ to $1 \times 10^{18}$ atoms/cm$^3$.

Figure 18C:
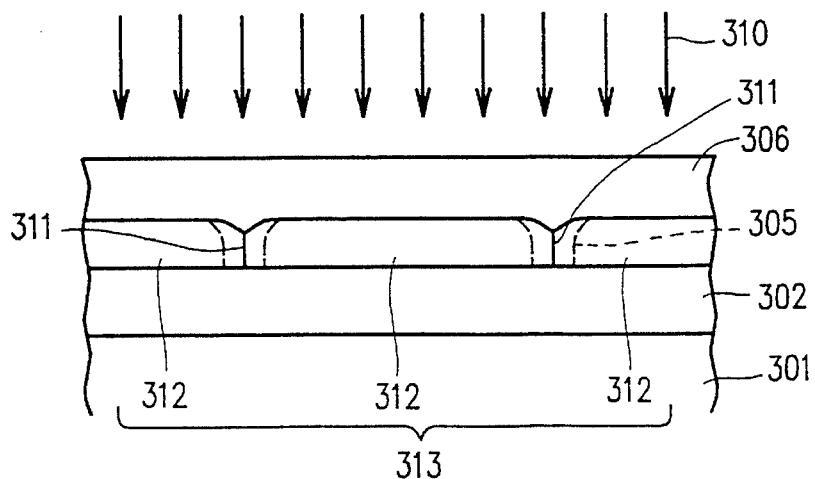

Next, as shown in FIG. 18C, an excimer laser beam 310 is irradiated to the crystalline silicon film 303 as high-energy light; as a result, the amorphous silicon regions 305 are taken in the crystals to form larger crystalline silicon regions 312. The amorphous silicon regions 305 disappear, and respective two adjacent crystalline silicon regions 312 form a crystal grain interface 311.

Figure 18D:
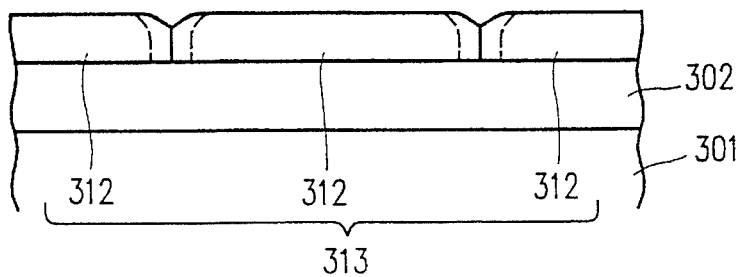

Thereafter, as shown in FIG. 18D, the silicon oxide film 306 is removed. At this time, nickel in the silicon oxide film 306 is removed. In addition, contaminants on the surface of the crystalline silicon film 303 can be simultaneously removed.

As described above, a polycrystalline silicon film having good uniformity and excellent electrical characteristics almost close to those of single crystal can be obtained. In the case where a TFT is produced by using the resulting polycrystalline silicon film, satisfactory characteristics as an n-type TFT such as 100 or more of electric field effect mobility and about 8 digits of ON/OFF ratio can be obtained.

In the present example, since the concentration of nickel contained in the crystalline silicon is reduced during the above-mentioned surface oxidation step, the nickel is not deposited by the irradiation of a laser beam. Thus, the following problems can be prevented: The catalytic element is deposited on the silicon film surface by heat treatment, and a leak current is caused to flow through deposited metal between a source and a drain of a produced TFT.

In the case where the oxidation step is not conducted, it is required to remove the precipitated catalytic element. The catalytic element is a silicon compound, so that the surface of the silicon film is damaged during the removal of the deposited catalytic element. This causes damage on the surface of the silicon film, which leads to the deterioration of the electron mobility caused by the damage and contact defects and causes problems in reliability and electrical stability. However, according to the present invention, such problems are not caused.

EXAMPLE 4

FIGS. 19A through 19F are respectively a cross-sectional view schematically showing a method for producing a semiconductor substrate of Example 4 according to the present invention.

As shown in FIG. 19A, the surface of a substrate 401 made of an insulating material such as glass is washed, and then SiO$_2$ is deposited on the substrate 401 to a thickness of about 200 nm by a sputtering apparatus to form a base coat film 402 thereon.

On the base coat film 402, an amorphous silicon film 403 having a thickness of about 100 nm is deposited by CVD or sputtering. The thickness of the amorphous silicon film 403 can be in the range of 20 nm to 150 nm.

Next, nickel is selectively introduced into a region 404 of the amorphous silicon film 403 as a catalytic element for accelerating the crystallization of the amorphous silicon film 403, as shown in FIG. 19A.

Thereafter, the resulting substrate 401 is heat-treated at a temperature of 550° C. As a result, crystal cores are formed in about 3 to 10 minutes. Furthermore, needle-shaped or column-shaped crystals grow in a radial shape with respect to the respective crystal cores. In the meantime, as represented by an arrow 405 in FIG. 19B, the needle-shaped or column-shaped crystals grow outward (i.e., toward a non-nickel introduced region) from the region 404 along the surface of the substrate 401. Nickel can be introduced into the amorphous silicon film 403 by a method for diffusing Ni ions in the amorphous silicon film 403 under the condition that a mask for selective ion implantation is formed on the amorphous silicon film 403 after forming a film with an Ni or Ni-Si compound by sputtering; a method for depositing Ni ions on the surface of the amorphous silicon film 403 in a plasma chamber having an Ni electrode by plasma treatment, and then diffusing Ni ions in the amorphous silicon film 403; or a method for implanting Ni ions into the amorphous silicon film 403 by ion doping.

FIG. 19C is a cross-sectional view of the substrate 401 at a time when the crystallization by heat treatment is completed. The amorphous silicon is crystallized to form a crystalline silicon film 409 including a crystalline silicon region 406. A needle-shaped or column-shaped crystalline silicon region (lateral growth region) 406 is positioned outside of a nickel selectively-introduced region 404, and a crystal growth end region 407 is positioned outside of the nickel selectively-introduced region 404. In the nickel selectively-introduced region 404 and the crystal growth end region 407, the concentration of nickel is higher, compared with that in the crystalline silicon region 406.

FIG. 19D is a cross-sectional view taken along a line 19D–19D of FIG. 19C. The crystalline silicon film 409 includes the crystalline silicon region 406 and each grain boundary between the two adjacent crystalline silicon regions 406 includes an amorphous silicon region 408.

Next, as shown in FIG. 19E, the surface of the crystalline silicon film 409 is oxidized. Silicon increases in volume by oxidation. Therefore, a surface 414 of a formed silicon oxide film 410 is positioned higher from the substrate 401 than a surface 412 of the crystalline silicon film 409 before oxidation. The silicon oxide film 410 preferably has a thickness in the range of about 10 nm to about 30 nm. After the oxidation, the crystalline silicon film 409 has a surface 413. In the present example, thermal oxidation is conducted in an atmosphere of water vapor at 600° C. for 12 hours. The thermal oxidation decreases the thickness of the crystalline silicon film 409 by about 10 nm.

Since the amorphous silicon regions 408 are oxidized faster than the crystalline silicon regions 406, the amorphous silicon regions 408 are oxidized deeper than the crystalline silicon regions 406 on the interface between the crystalline silicon film 409 and the silicon oxide film 410 (i.e., the surface 413 of the crystalline silicon film 409). Furthermore, since the amorphous silicon region 408 having a high concentration of nickel is oxidized faster, the concentration of nickel contained in the crystalline silicon film 409 can be decreased. According to the results of a SIMS analysis, in the nickel selectively-introduced region 404 and the crystal growth end region 407, the concentration of nickel is decreased from about $1 \times 10^{19}$ atoms/cm$^3$ to about $1 \times 10^{18}$ atoms/cm$^3$; and in the crystalline silicon region 406, the concentration of nickel is decreased from about $1 \times 10^{18}$ atoms/cm$^3$ to about $4 \times 10^{17}$ atoms/cm$^3$.

Thereafter, as shown in FIG. 19F, the silicon oxide film 410 is removed. At this time, nickel in the silicon oxide film 410 is removed together with the silicon oxide film 410. In addition, contaminants on the surface of the crystalline silicon film 409 can be simultaneously removed. Next, an excimer laser beam 415 is irradiated to the crystalline silicon film 409 as high-energy light; as a result, the amorphous silicon regions 408 are taken in the crystals to form larger crystalline silicon regions 416. The amorphous silicon regions 408 disappear, and respective two adjacent crystalline silicon regions 416 form a crystal grain interface 417.

As described above, a crystalline silicon film 418 having good uniformity on the substrate surface and excellent electrical characteristics close to those of single crystal can be obtained. In addition, the crystalline silicon film 418 has its growth direction of needle-shaped or column-shaped crystals controlled from the nickel selectively-introduced region 404 to the non-nickel introduced region (outside).

EXAMPLE 5

FIGS. 20A through 20F are respectively a cross-sectional view schematically showing a method for producing a semiconductor substrate of Example 5 according to the present invention.

Figure 20A:
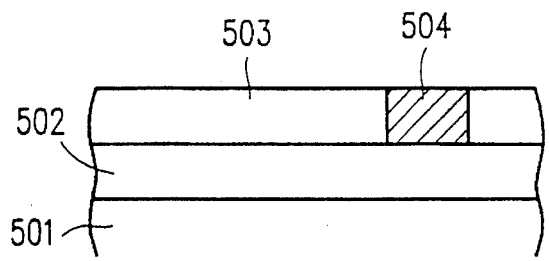
FIGS. 20A through 20F are respectively cross-sectional views illustrating a method for producing a semiconductor film of Example 5 according to the present invention.
Figure 20B:
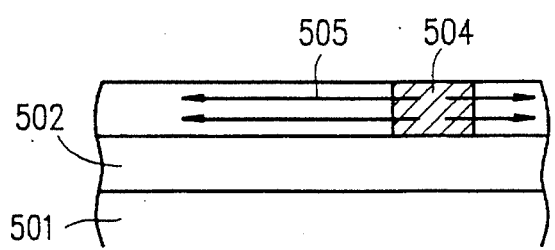

As shown in FIG. 20A, the surface of a substrate 501 made of an insulating material such as glass is washed, and then silicon dioxide is deposited on the substrate 501 to a thickness of about 200 nm by a sputtering apparatus to form a base coat film 502 thereon.

On the base coat film 502, an amorphous silicon film 503 having a thickness of about 100 nm is deposited by CVD or sputtering. The thickness of the amorphous silicon film 503 can be in the range of 20 to 150 nm.

Next, nickel is selectively introduced into a region 504 of the amorphous silicon film 503 as a catalytic element for accelerating the crystallization of the amorphous silicon film 503, as shown in FIG. 20A.

Thereafter, the resulting substrate 501 is heat-treated at a temperature of 550° C. As a result, crystal cores are formed in about 3 to 10 minutes. Furthermore, needle-shaped or column-shaped crystals grow in a radial shape with respect to the respective crystal cores. In the meantime, as represented by an arrow 505 in FIG. 20B, the needle-shaped or column-shaped crystals grow outward (i.e., toward a non-nickel introduced region) from the region 504 along the surface of the substrate 501. Nickel can be introduced into the amorphous silicon film 503 by a method for diffusing Ni ions in the amorphous silicon film 503 under the condition that a mask for selective ion implantation is formed on the amorphous silicon film 503 after forming a film with an Ni or Ni-Si compound by sputtering; a method for depositing Ni ions on the surface of the amorphous silicon film 503 in a plasma chamber having an Ni electrode by plasma treatment, and diffusing Ni ions in the amorphous silicon film 503; or a method for implanting Ni ions into the amorphous silicon film 503 by ion doping.

Figure 20C:
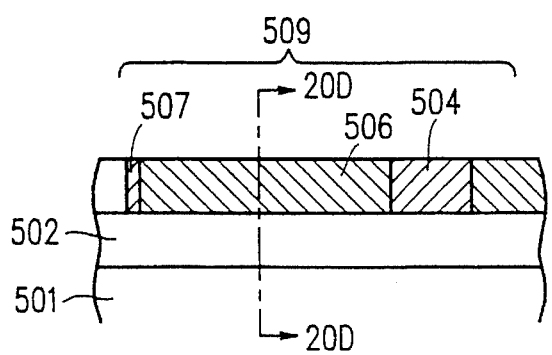

FIG. 20C is a cross-sectional view of the substrate 501 at a time when the crystallization by heat treatment is completed. The amorphous silicon is crystallized to form a crystalline silicon film 509 including a crystalline silicon region 506. A needle-shaped or column-shaped crystalline silicon region (lateral growth region) 506 is positioned outside of a nickel selectively-introduced region 504, and a crystal growth end region 507 is positioned outside of the nickel selectively-introduced region 504. In the nickel selectively-introduced region 504 and the crystal growth end region 507, the concentration of nickel is higher, compared with that in the crystalline silicon region 506.

Figure 20D:
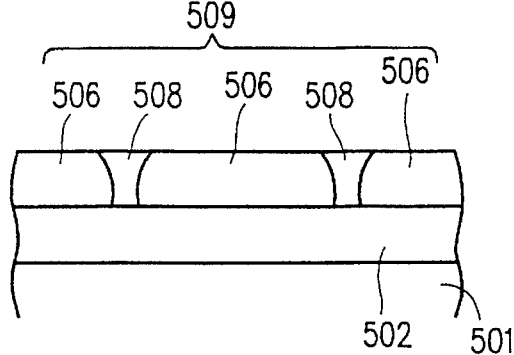

FIG. 20D is a cross-sectional view taken along a line 20D–20D of FIG. 20C. The crystalline silicon film 509 includes the crystalline silicon region 506 and each grain boundary between the two adjacent crystalline silicon regions 506 includes an amorphous silicon region 508.

Figure 20E:
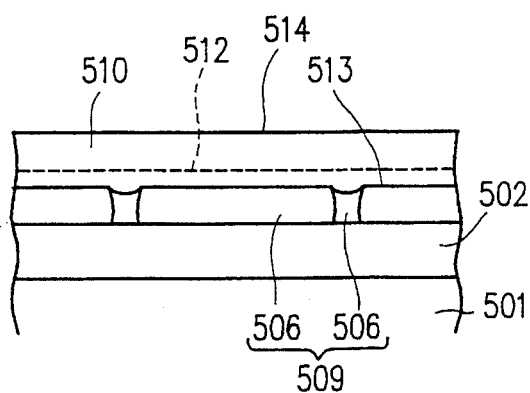

Next, as shown in FIG. 20E, the surface of the crystalline silicon film 509 is oxidized. Silicon increases in volume by oxidation. Therefore, a surface 514 of a formed silicon oxide film 510 is positioned higher from the substrate 501 than a surface 512 of the crystalline silicon film 509 before oxidation. The silicon oxide film 510 preferably has a thickness in the range of about 10 nm to about 30 nm. After the oxidation, the crystalline silicon film 509 has a surface 513. In the present example, thermal oxidation is conducted in an atmosphere of water vapor at 600° C. for 12 hours. The thermal oxidation decreases the thickness of the crystalline silicon film 509 by about 10 nm.

Since the amorphous silicon regions 508 are oxidized faster than the crystalline silicon regions 506, the amorphous silicon regions 508 are oxidized deeper than the crystalline silicon regions 506 on the interface between the crystalline silicon film 509 and the silicon oxide film 510 (i.e., the surface 513 of the crystalline silicon film 509). Furthermore, since the amorphous silicon region 508 having a high concentration of nickel is oxidized faster, the concentration of nickel contained in the crystalline silicon film 509 can be decreased. According to the results of a SIMS analysis, in the nickel selectively-introduced region 504 and the crystal growth end region 507, the concentration of nickel is decreased from about $1 \times 10^{19}$ atoms/cm$^3$ to about $1 \times 10^{18}$ atoms/cm$^3$; and in the crytalline silicon region 506, the concentration of nickel is decreased from about $1 \times 10^{18}$ atoms/cm$^3$ to about $4 \times 10^{17}$ atoms/cm$^3$.

Figure 20F:
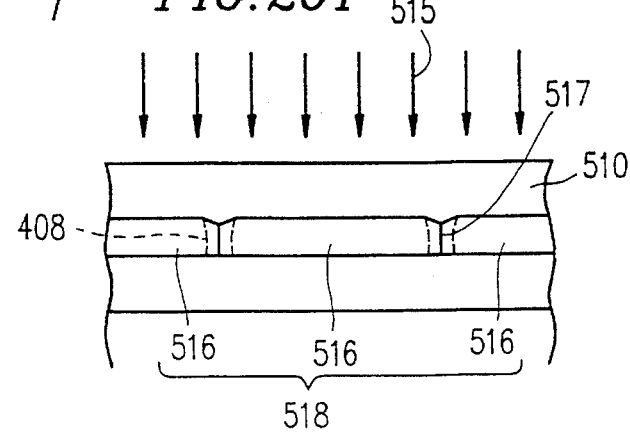

Next, as shown in FIG. 20F, an excimer laser beam 515 is irradiated to the crystalline silicon film 509 as high-energy light; as a result, the amorphous silicon regions 508 are taken in the crystals to form larger crystalline silicon regions 516. The amorphous silicon regions 508 disappear, and each two adjacent crystalline silicon regions 516 form a crystal grain interface 517.

Thereafter, as shown in FIG. 20F, the silicon oxide film 510 is removed. At this time, nickel in the silicon oxide film 510 is removed together with the silicon oxide film 510. In addition, contaminants on the surface of the crystalline silicon film 509 can be simultaneously removed.

As described above, a crystalline silicon film 518 having good uniformity on the substrate surface and excellent electrical characteristics close to those of single crystal, and containing no amorphous silicon regions can be obtained. In addition, the crystalline silicon film 518 has its growth direction of needle-shaped or column-shaped crystals controlled from the nickel selectively-introduced region 504 to a non-introduced region (outside).

When a semiconductor device is produced by using either of the crystalline silicon films obtained in the above-mentioned Examples 2 through 5 as an active region of a TFT, the active region of the TFT can be made of a crystalline silicon film having crystallinity almost close to that of single crystal silicon, so that high electric field effect mobility can be obtained. Since the crystalline silicon film has a low concentration of a catalytic element, the deterioration of OFF characteristics is not caused. Furthermore, the catalytic element is not deposited in the course of the production of the semiconductor device; therefore, problems such as the leakage of a current, the deterioration of mobility, and contact defects are not caused. Thus, a semiconductor device excellent in reliability and electrical stability can be obtained.

EXAMPLE 6

Figure 21:
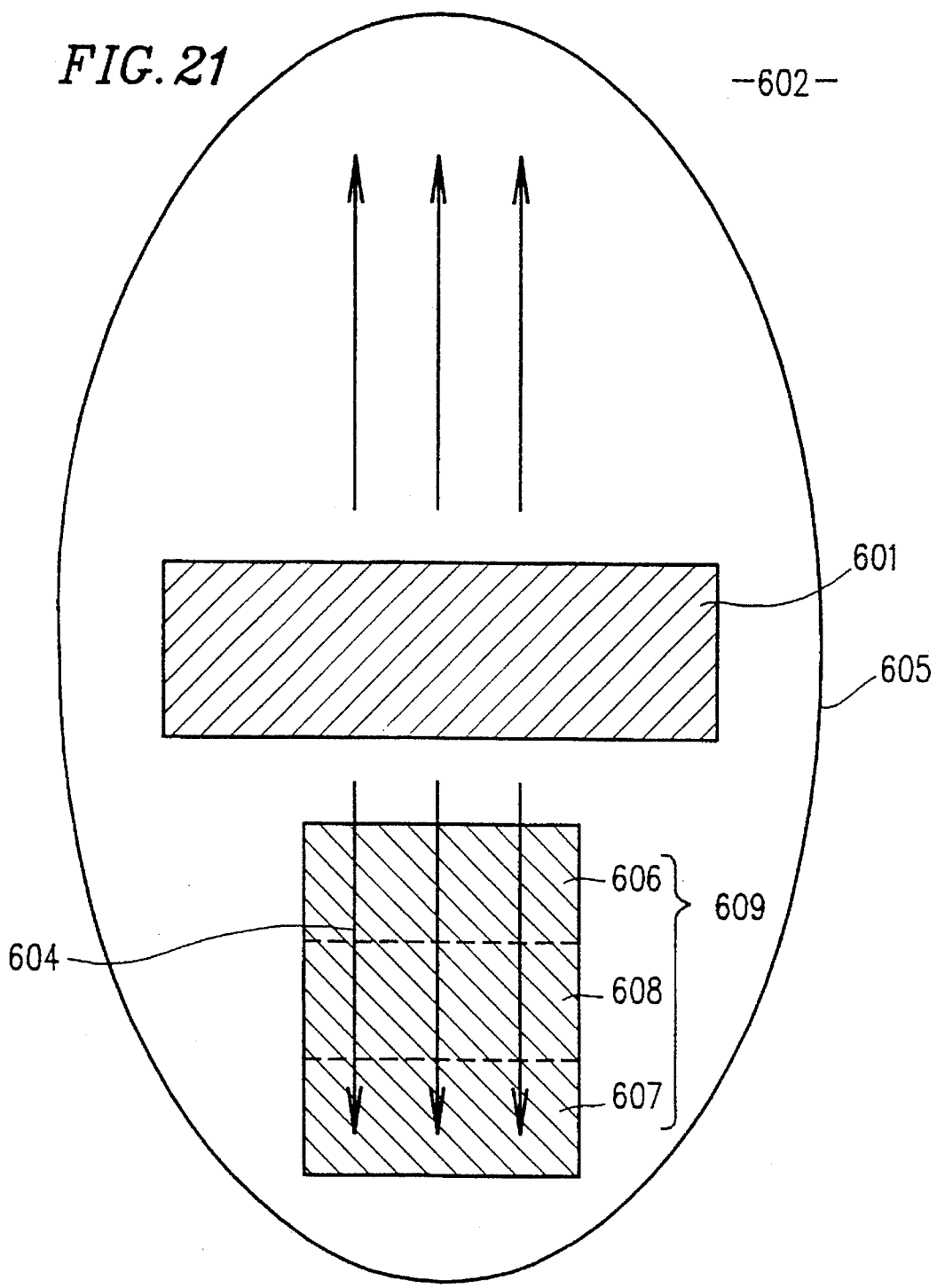
FIG. 21 is a plan view showing the positioning of a TFT of Example 6 according to the present invention.

In the present example, a TFT is produced with a construction as shown in FIG. 21 by using a crystalline silicon film produced in Example 4 or 5.

In this figure, a material for accelerating the crystallization of amorphous silicon is introduced into an amorphous silicon film 602 from a selectively-introduced region 601. After the introduction of the material for accelerating the crystallization, the amorphous silicon film 602 is heated; consequently, crystal cores are formed in a region 601 in about 3 to 10 minutes. When the amorphous silicon film 602 is further heated, needle-shaped or column-shaped crystals grow in a radial shape with respect to the crystal cores. As represented by an arrow 604, the needle-shaped or column-shaped crystals grow outward (i.e., toward a non-introduced region) from the selectively-introduced region 601 along the surface of the substrate. When heat treatment is completed, a crystalline silicon region 605 including the selectively-introduced region 601 is formed. In the crystalline silicon region 605, a plurality of needle-shaped or column-shaped silicon crystals are formed so as to extend along the arrow 604, and each tip end of the crystals reaches an outer periphery of the crystalline silicon region 605.

A TFT 609 includes a source region 606, a drain region 607, and a channel region 608 respectively formed in the crystalline silicon region 605. The direction in which carriers move in the channel region 608 is identical with the crystal growth direction represented by the arrow 604.

As shown in the figure, the source region 606, the drain region 607, and the channel region 608 which are device regions of the TFT 609 are positioned in the crystalline silicon region 605 and outside of the selectively-introduced region 601. The TFT 609 has high carrier mobility caused by crystalline silicon as well as a low concentration of a material for accelerating the crystallization in the device regions; therefore, the TFT 609 has a low OFF current and less leakage of a current. Furthermore, the TFT 609 has high reliability and high stability of electrical characteristics.

Figure 22:
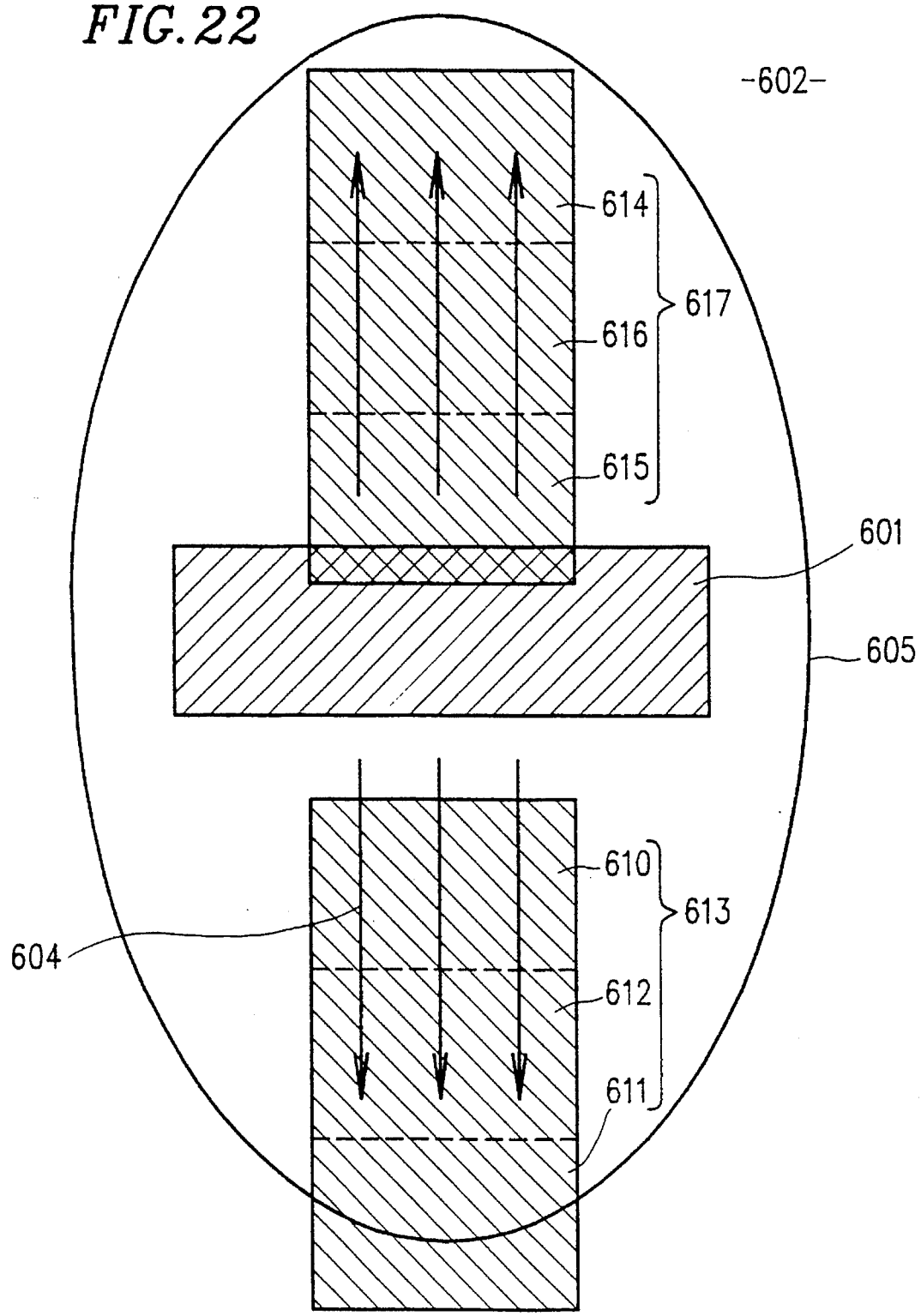
FIG. 22 is a plan view showing another positioning of a TFT of Example 6 according to the present invention.

If the entire channel region is positioned outside of the selectively-introduced region 601 and in the crystalline silicon region 605, a TFT with high carrier mobility can be produced. For example, as shown in FIG. 22, in a TFT 613 having a source region 610, a drain region 611, and a channel region 612, a part of the drain region 611 may be formed outside of the crystalline silicon region 605. Alternatively, in a TFT 617 having a source region 614, a drain region 615, and a channel region 616, a part of the drain region 615 may be formed in the selectively-introduced region 601.

However, in the case where the material for accelerating the crystallization is introduced into the amorphous silicon film from the selectively-introduced region, for the purpose of obtaining sufficiently long needle-shaped or column-shaped silicon crystals, it is required to increase the amount of the material to be introduced by about 10 to 100 times, compared with the case where the material is introduced into the entire surface region of the amorphous silicon film. Accordingly, in the region into which the material for accelerating the crystallization is introduced, the surface tends to be made rough because of the weak laser-resistance and hydrofluoric acid resistance of the silicon film. The rough surface of the silicon film will cause a decrease in mobility of a TFT and the contact defects.

Thus, in the case where a part of the source region and the drain region are in the selectively-introduced region, it is preferred to take countermeasures so as not to cause the contact defects.

Although the present invention is described by way of illustrative examples, the present invention is not limited thereto. The present invention can be variously modified within the spirit and scope of the appended claims. In addition to the active matrix substrates for liquid crystal display devices, the semiconductor device of the present invention can also be applied to a contact type image sensor, a driver built-in thermal head, an optical write device or display device of driver built-in type using an organic electroluminescence (EL) element as a light-emitting element, and a three-dimensional IC. By applying the semiconductor device of the present invention to these devices, these devices can be made high-speed and have high resolution and high performance. Furthermore, the present invention can be applied to a process for producing various kinds of semiconductor devices such as a TFT.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a semiconductor film, comprising the steps of:
   (a) forming an amorphous semiconductor film on a substrate having a surface with an insulating property;
   (b) introducing a material for accelerating crystallization of the amorphous semiconductor film into at least a part of the amorphous semiconductor film;
   (c) crystallizing the amorphous semiconductor film by heating to obtain a crystalline semiconductor film from the amorphous semiconductor film;
   (d) oxidizing a surface of the crystalline semiconductor film to form a semiconductor oxide film containing a part of the material for accelerating the crystallization on the surface of the crystalline semiconductor film; and
   (e) removing the semiconductor oxide film.

2. A method for producing a semiconductor film according to claim 1, further comprising a step of irradiating high energy light to the crystalline semiconductor film either between the step (d) and the step (e) or after the step (e).

3. A method for producing a semiconductor film according to claim 1, wherein, during the step (b), the material for accelerating the crystallization of the amorphous semiconductor film is introduced into the amorphous semiconductor film from an entire surface thereof.

4. A method for producing a semiconductor film according to claim 1, wherein a crystal growth direction of the crystalline semiconductor film is substantially parallel with the substrate.

5. A method for producing a semiconductor film according to claim 1, wherein, during the step (d), the crystalline semiconductor film is heated in an atmosphere containing at least oxygen or water vapor.

6. A method for producing a semiconductor film according to claim 5, wherein the atmosphere further contains one selected from the group consisting of nitric acid gas, halogen, and hydrogen halide.

7. A method for producing a semiconductor film according to claim 6, wherein the crystalline semiconductor film is heated in the atmosphere at a temperature of 650° C. or lower.

8. A method for producing a semiconductor film according to claim 5, wherein the atmosphere is kept at a pressure of about 25 arm.

9. A method for producing a semiconductor film according to claim 5, wherein the atmosphere is in a plasma state.

10. A method for producing a semiconductor film according to claim 7, wherein the crystalline semiconductor film is further irradiated with UV-rays.

11. A method for producing a semiconductor film according to claim 1, wherein, during the step (d), the crystalline semiconductor film is dipped into a solution containing ions selected from the group consisting of sulfuric acid ions, nitric acid ions, nitrous acid ions, permanganate ions, chromic acid ions, chlorine ions, and hypochlorous acid ions.

12. A method for producing a semiconductor film according to claim 1, wherein the material for accelerating the crystallization contains one selected from the group consisting of Ni, Co, Pd, Pt, Fe, Cu, Ag, Au, In, Sn, P, As, and Sb.

13. A method for producing a semiconductor device, comprising the steps of:

(a) forming an amorphous semiconductor film on a substrate having a surface with an insulating property;

(b) introducing a material for accelerating crystallization of the amorphous semiconductor film into at least a part of the amorphous semiconductor film;

(c) crystallizing the amorphous semiconductor film by heating to obtain a crystalline semiconductor film from the amorphous semiconductor film;

(d) oxidizing a surface of the crystalline semiconductor film to form a semiconductor oxide film containing a part of the material for accelerating the crystallization on the surface of the crystalline semiconductor film;

(e) removing the semiconductor oxide film; and (f) providing a semiconductor device region in the crystalline semiconductor film.

14. A method for producing a semiconductor device according to claim 13, further comprising a step (g) of irradiating high energy light to the crystalline semiconductor film either between the step (d) and the step (e) or between the step (e) and the step (f).

15. A method for producing a semiconductor device according to claim 13, wherein a crystal growth direction of the crystalline semiconductor film is substantially parallel with the substrate.

16. A method for producing a semiconductor device according to claim 13, wherein, in the semiconductor device region, a direction in which carriers in the crystalline semiconductor film move is substantially parallel with the crystal growth direction of the crystalline semiconductor film.

17. A method for producing a semiconductor device according to claim 13, wherein, in the semiconductor device region, a direction in which carriers in the crystalline semiconductor film move is substantially vertical to the crystal growth direction of the crystalline semiconductor film.

18. A method for producing a semiconductor device according to claim 13, wherein the semiconductor device further has a channel in the semiconductor device region, and the channel is at least provided in a region other than the part of the crystalline semiconductor film.

19. A method for producing a semiconductor device according to claim 13, wherein, during the step (b), the material for accelerating the crystallization of the amorphous semiconductor film is introduced into the amorphous semiconductor film from an entire surface thereof.

20. A method for producing a semiconductor device according to claim 13, wherein, during the step (d), the crystalline semiconductor film is heated in an atmosphere containing at least oxygen or water vapor.

21. A method for producing a semiconductor device according to claim 20, wherein the atmosphere contains one selected from the group consisting of nitric acid gas, halogen, and hydrogen halide.

22. A method for producing a semiconductor device according to claim 21, wherein the crystalline semiconductor film is heated in the atmosphere at a temperature of 650° C. or lower.

23. A method for producing a semiconductor device according to claim 22, wherein the atmosphere is kept at a pressure of about 25 atm.

24. A method for producing a semiconductor device according to claim 20, wherein the atmosphere is in a plasma state.

25. A method for producing a semiconductor device according to claim 20, wherein the crystalline semiconductor film is further irradiated with UV-rays.

26. A method for producing a semiconductor device according to claim 13, wherein, during the step (d), the crystalline semiconductor film is dipped into a solution containing ions selected from the group consisting of sulfuric acid ions, nitric acid ions, nitrous acid ions, permanganate ions, chromic acid ions, chlorine ions, and hypochlorous acid ions.

27. A method for producing a semiconductor device according to claim 13, wherein the material for accelerating the crystallization contains one selected from the group consisting of Ni, Co, Pd, Pt, Fe, Cu, Ag, Au, In, Sn, P, As, and Sb.

* * * * *